(12) United States Patent
Fujii

(10) Patent No.: US 6,872,653 B2
(45) Date of Patent: Mar. 29, 2005

(54) MANUFACTURING METHOD OF SEMICONDUCTOR DEVICE

(75) Inventor: Yuji Fujii, Tamamura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/417,225

(22) Filed: Apr. 17, 2003

(65) Prior Publication Data

US 2003/0199156 A1 Oct. 23, 2003

(30) Foreign Application Priority Data

Apr. 19, 2002 (JP) .................................... 2002-118163

(51) Int. Cl.[7] .......................................... H01L 21/4763
(52) U.S. Cl. .................... 438/632; 438/182; 438/597; 438/618; 438/637; 438/688
(58) Field of Search ................................. 438/182, 242, 438/597, 618, 622, 625, 627, 632, 637, 642–644, 648, 653–658, 688

(56) References Cited

U.S. PATENT DOCUMENTS

| | | | | |
|---|---|---|---|---|
| 5,169,803 A | * | 12/1992 | Miyakawa | 438/625 |
| 5,266,521 A | * | 11/1993 | Lee et al. | 438/642 |
| 5,512,516 A | * | 4/1996 | Nishida et al. | 438/648 |
| 5,789,317 A | * | 8/1998 | Batra et al. | 438/642 |
| 5,940,721 A | | 8/1999 | Kinzer et al. | |
| 6,140,236 A | * | 10/2000 | Restaino et al. | 438/687 |
| 6,207,558 B1 | * | 3/2001 | Singhvi et al. | 438/648 |
| 6,638,850 B1 | | 10/2003 | Inagawa et al. | |
| 2004/0012051 A1 | * | 1/2004 | Matsuda et al. | 257/330 |

FOREIGN PATENT DOCUMENTS

JP    2001-267569 A    9/2001

* cited by examiner

Primary Examiner—Asok Kumar Sarkar
(74) Attorney, Agent, or Firm—Antonelli, Terry, Stout & Kraus, LLP

(57) ABSTRACT

After deposition of a conductor film made of titanium tungsten over a main surface of a semiconductor substrate formed with grooves, an initial conductor film made of aluminium is further deposited. Subsequently, the conductor film is made to reflow and run into the grooves. Thereafter, while heating, further conductor films are respectively deposited, thereby causing these conductor films to run into the grooves. The provision of the initial conductor film suppresses or prevents aluminium in the further conductor films and silicon in the semiconductor substrate from reacting with each other during reflowing of the conductor films.

18 Claims, 19 Drawing Sheets

1: SEMICONDUCTOR SUBSTRATE
6: GATE INSULATING FILM
7: GATE ELECTRODE
8: CAP INSULATING FILM
10a: SIDE WALL
11: GROOVE (SECOND GROOVE)
13: GROOVE (SECOND GROOVE)
15a: CONDUCTIVE FILM (FIRST CONDUCTIVE FILM)
15b: SILICIDE LAYER (COMPOUND LAYER)
15c: CONDUCTIVE FILM (SECOND CONDUCTIVE FILM)
16a–16c: CONDUCTIVE FILM (CONDUCTIVE FILM MADE MAINLY OR ALUMINIUM)

1 : SEMICONDUCTOR SUBSTRATE
6 : GATE INSULATING FILM
7 : GATE ELECTRODE
8 : CAP INSULATING FILM
10a : SIDE WALL
11 : GROOVE (SECOND GROOVE)
13 : GROOVE (SECOND GROOVE)
15a : CONDUCTIVE FILM
      (FIRST CONDUCTIVE FILM)
15b : SILICIDE LAYER
      (COMPOUND LAYER)
15c : CONDUCTIVE FILM
      (SECOND CONDUCTIVE FILM)
16a~16c : CONDUCTIVE FILM (CONDUCTIVE
          FILM MADE MAINLY OR ALUMINIUM)

MANUFACTURING METHOD OF SEMICONDUCTOR DEVICE

BACKGROUND OF THE INVENTION

The present invention relates to a technique for use in the manufacture of a semiconductor device; and, more particularly, the invention relates to a technique that is effective for application to a wiring process that includes a step of burying a conductive film, that is made mainly of aluminium (Al), inside an opening for wiring.

The wiring technique studied by us is, for example, as set out below. Initially, an opening for wiring is formed in a semiconductor substrate, after which a titanium (Ti) film, for example, is deposited on the semiconductor substrate, including the inside of the wiring opening. Subsequently, an aluminium film, for example, is deposited on the titanium film at low temperatures and high power to a relatively large thickness (e.g. about 200 nm). Thereafter, the semiconductor substrate is maintained at high temperatures (e.g. about 400° C.) until the aluminium film is deposited to a desired thickness (e.g. about several hundreds of nanometers). The high temperatures are kept continuously over several minutes to cause reflow of the aluminium film, thereby causing the opening to be buried therewith.

A wiring technique is set out, for example, in Japanese Laid-open Patent Application No. 2001-267569. In this application, a technique is disclosed wherein a source electrode of a power MOSFET (Metal Oxide Semiconductor Field Effect Transistor) is constituted of a barrier layer that is made, for example, of titanium tungsten, titanium nitride (TiN) or the like, and this barrier layer is built up with pure aluminium thereon, so as to prevent a failure from occurring upon ultrasonic wire bonding.

SUMMARY OF THE INVENTION

We have found that the wiring technique studied by us has the following problems. If the amount of buried aluminium inside the opening for wiring increases, then it becomes necessary to heat the aluminium to higher temperatures so as to enhance the reflowability of the aluminium. Nevertheless, the barrier properties of titanium are not satisfactory, so that when the heating temperature exceeds, for example, about 400° C., a reaction between the aluminium and silicon (Si) proceeds, with some possibility that a junction leakage failure will occur.

An object of the present invention is to provide a technique that is capable of improving the reliability of semiconductor devices.

The above and other objects and novel features of the present invention will become apparent from the following description, when taken with reference to the accompanying drawings.

A typical embodiment of the invention, among those embodiments disclosed in this application, will be briefly described below.

According to the invention, there is provided a method of manufacture of a semiconductor device, which method comprises the steps of: depositing, on a semiconductor substrate including an opening for wiring, a first conductive film having a structure that is capable of suppressing or preventing a reaction from occurring between an aluminium atom and a constituent atom of the semiconductor substrate upon thermal treatment for re-melting of the conductive film, which is made mainly of aluminium; and thermally treating the conductor film made mainly of aluminium after, or in the course of deposition thereof, until re-melting occurs, thereby causing the aluminium-based conductor film to flow and run into the opening for wiring.

DETAILED DESCRIPTION OF THE PREFERRED EMBODIMENTS

Figure 1:
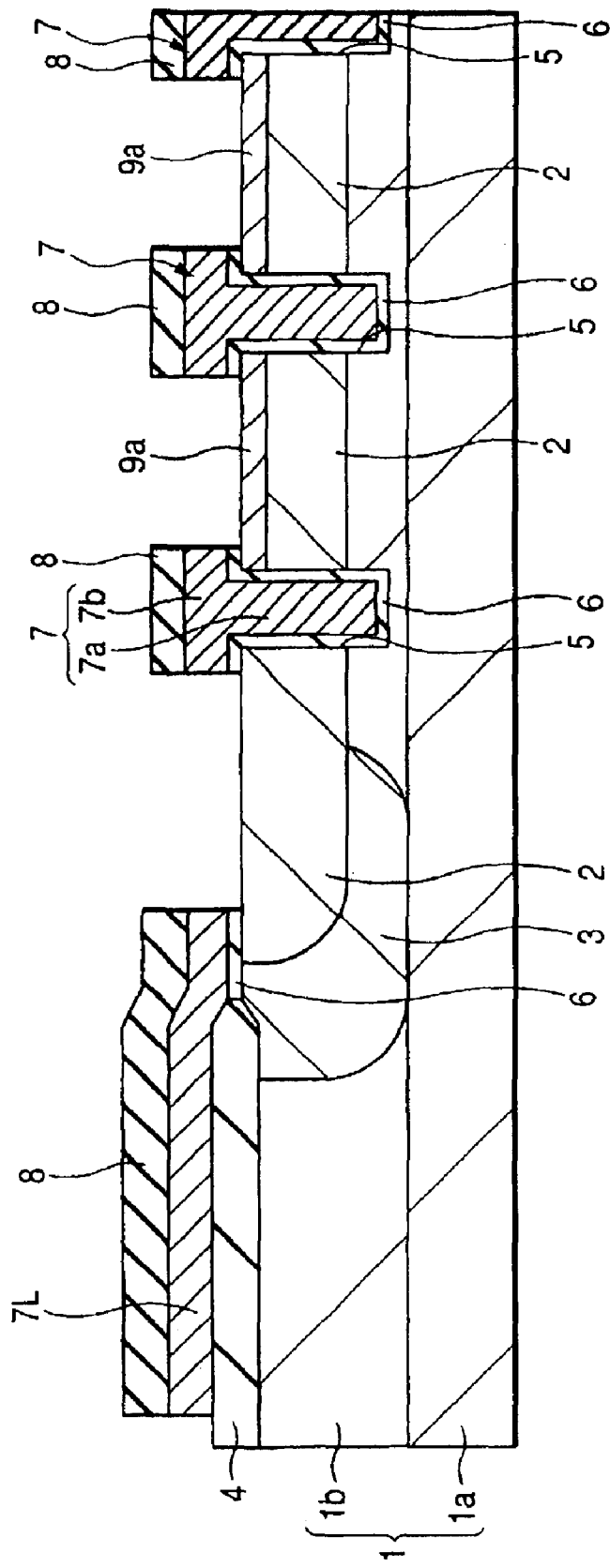
FIG. 1 is a sectional view of the structure during a step in the process of manufacture of a semiconductor device according to one embodiment of the invention.

Although embodiments of the invention are illustrated by division of the subject matter into a plurality of sections or sub-embodiments, if expediently necessary, these divisions are not to be taken as being mutually irrelevant to one another, unless otherwise stated. More particularly, one division may be in a relation with a modification, details, supplemental explanation and the like of part or all of the others. In the following description of the embodiments, where reference is made to a number and other parameters of elements (including the number, numerical value, quantity, range and the like), they should not be construed as being limited to specified values or numbers, respectively, except for the case where they are otherwise specified or limited to a specific value apparently in principle. That is, those values smaller than or larger than the respective specified values may also be within the scope of the invention.

Moreover, it is as a matter of course that constituent elements (including steps) in the following embodiments are not always essential, except in the case where otherwise specified or where such elements are considered to be apparently essential in principle. Likewise, if reference is made to the shape, position, relation and the like of the constituent elements, then substantially the same or similar shapes and the like are also within the scope of the invention, except for the case where they are otherwise specified or where such shapes should not be apparently included as a matter of principle. This is true of the above-indicated numbers and ranges as well.

Throughout the drawings illustrating the embodiments of the invention, like reference numerals indicate like parts or members having the same function, which parts or members are not repeatedly explained after once having been explained.

In the description of the embodiments of the invention, by the expression, for example, "composed or made of aluminium", it is intended that aluminium is used as a main component. In general, it is assumed that highly pure aluminium contains impurities, and, thus, a member made, for example, of aluminium should not be construed as excluding the inclusion of additives or impurities therein. This is not limited to aluminium, but is applied to other types of metals and the like (such as titanium tungsten, tungsten, tantalum, nitrides thereof, and tungsten suicide or its nitride).

The embodiments of the invention will be described in detail with reference to the accompanying drawings.

(Embodiment 1)

A semiconductor substrate in accordance with Embodiment 1 has, for example, a n-channel power MISFET (Power Metal Insulator Semiconductor Field Effect Transistor: power transistor) having a trench gate structure. An example of a method of manufacture of a semiconductor device according to Embodiment 1 of the invention will be described with reference to FIGS. 1 to 14.

FIG. 1 is a sectional view of the structure during manufacture of the semiconductor device of Embodiment 1. The semiconductor device (hereinafter referred to simply as a substrate) is in the form of a so-called epitaxial wafer (hereinafter referred to simply as a wafer) having, for example, a structure in which an n⁻ type semiconductor layer $1b$ is deposited on an n⁺ semiconductor layer $1a$ using an epitaxial technique. The semiconductor layers $1a$, $1b$ are made, for example, of single crystal silicon (Si), respectively. The impurity concentration in the semiconductor layer $1a$ is, for example, at about $2.0 \times 10^{19}$ cm$^{-3}$, and that of the semiconductor layer $1b$ is, for example, at about $1.0 \times 10^{16}$ cm$^{-3}$.

The semiconductor layer $1b$ is formed with a p⁻ type semiconductor region 2 (well: first semiconductor region) therein. This semiconductor region 2 has channels for a plurality of power MISFET's (hereinafter referred to simply as power MIS('s) to be formed therein. The semiconductor region 2 is formed, for example, by distributing boron (B) from the main surface of the semiconductor layer $1b$ to an intermediate position along the thickness of the semiconductor layer $1b$. The peak concentration of the Impurity in the semiconductor region 2 is set, for example, at about $1 \times 10^{16}$ to about $1 \times 10^{18}$ cm$^{-3}$.

A p-type semiconductor region (well) 3 is formed along the outer peripheral end of the semiconductor region 2 in the semiconductor layer $1b$. Boron, for example, is contained in this semiconductor region 3. An isolation region 4 that is made, for example, of silicon oxide (SiO$_2$ or the like) is formed, according to a LOCOS (Local Oxidization of Silicon) technique or the like, at the isolation region in the main surface of the semiconductor layer $1b$. The isolation, region 4 may be in the form of a groove (trench isolation).

The active region surrounded by the isolation region 4 becomes a power MID-forming region. This active region is formed with a plurality of grooves (first grooves) 5 therein. The grooves 5, respectively, are provided for every cell, and they extend from the main surface of the semiconductor layer $1b$ to an intermediate position in the direction of the depth of the semiconductor layer $1b$, as viewed in section, and they extend along a certain direction as viewed in plane view. The inner wall surfaces of the groove 5 and the upper surface of the semiconductor layer $1b$ at an area around the opening of the groove 5 have a gate insulating film 6, that is made, for example, of silicon oxide, formed thereon.

A trench-type gate electrode 7 of the power MIS is formed on the gate insulating film 6. The gate electrode 7 is made, for example, of a low resistance polysilicon film and is shaped in the form of a T in section. More particularly, the gate electrode 7 has a first portion $7a$ that is buried inside the groove, from which it is separated by the gate insulating film 6, and a second portion $7b$ that joins the first portion $7a$, projects outwardly from the groove and has a width greater than the width of the groove 5 (i.e. the width along a minor direction).

At the outer periphery of the power MID-forming region, an extrinsic gate wiring 7L is formed on the main surface of the semiconductor layer $1b$, from which it is spaced by the gate insulating film 6 and the isolation region 4. The extrinsic gate wiring 7L is integrally formed with the respective gate electrodes 7 and is to be electrically connected therewith. A cap insulating film (first insulating film) 8, which is made, for example, of a silicon oxide film, is deposited, after patterning, over the gate electrodes 7 and the extrinsic gate wiring 7L.

An n-type semiconductor region (second semiconductor region) $9a$, serving as a source, is formed at a portion of the semiconductor layer 1b that is established between adjacent gate electrodes 7. This semiconductor region 9a is formed by distributing, for example, arsenic (As) from the main surface of the semiconductor layer 1b to an intermediate position along the depth of the semiconductor region 2, which processing has been already carried out prior to the formation of the groove 5. The peak concentration of the impurity in the semiconductor region 9a is, for example, about $1\times10^{18}$ to about $1\times10^{20}$ cm$^{-3}$.

Figure 2:
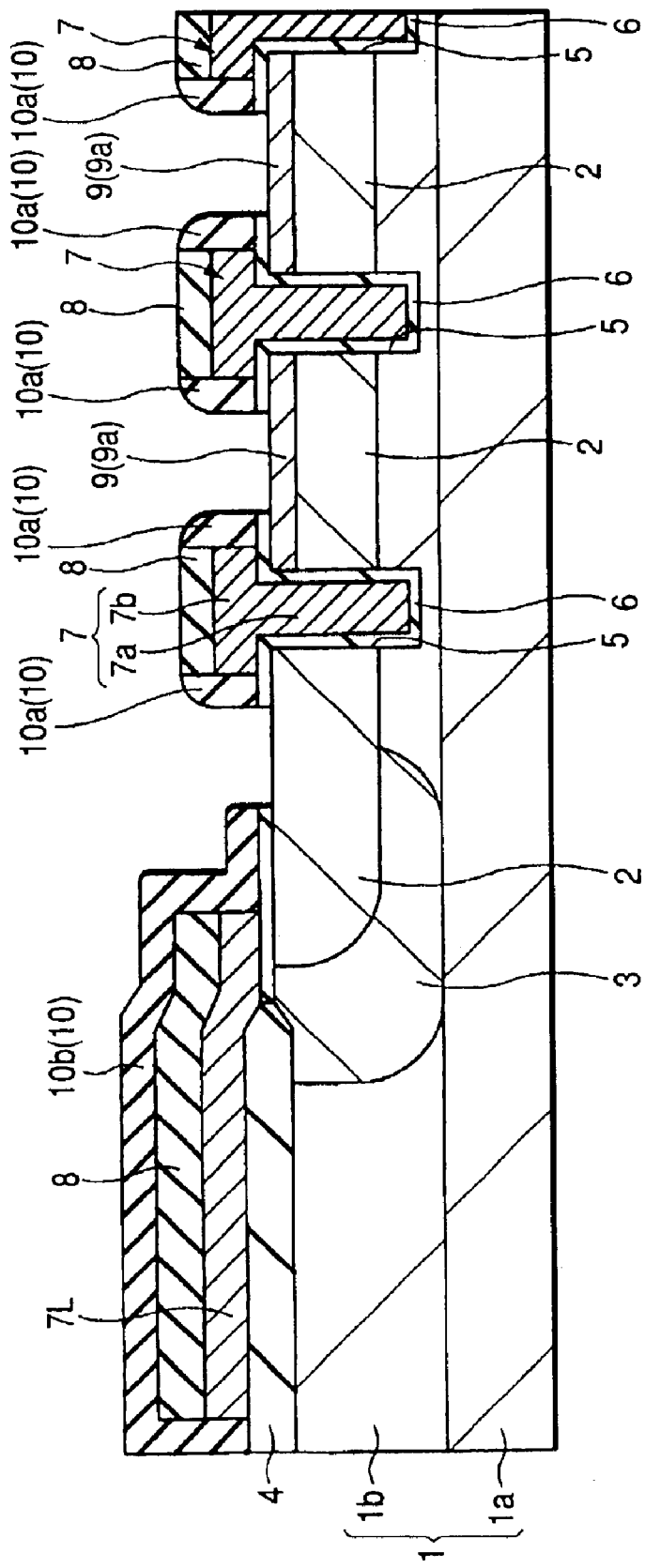
FIG. 2 is a sectional view of the structure during a step in the process of manufacture of the semiconductor device, subsequent to the step of FIG. 1.
Figure 3:
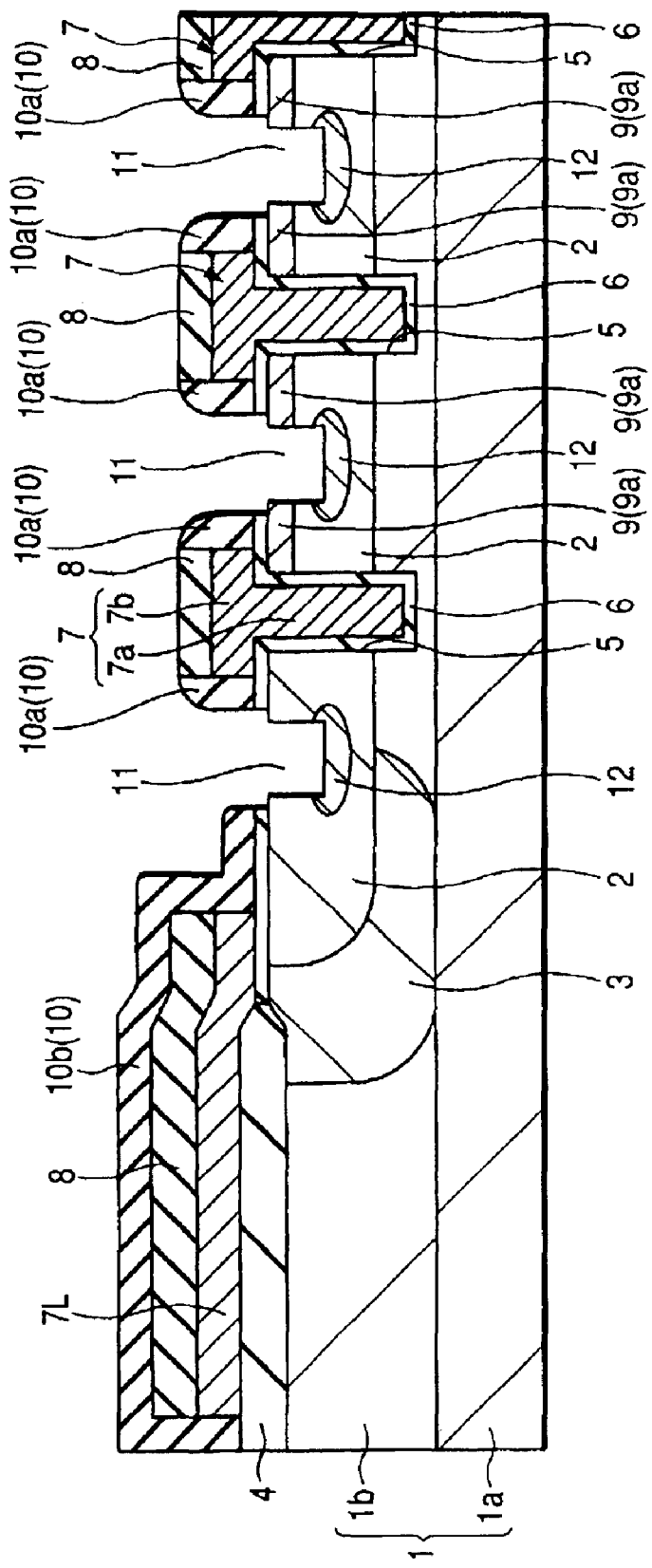
FIG. 3 is a sectional view of the structure during a step in the process of manufacture of the semiconductor device, subsequent to the steps of FIG. 2.

FIGS. 2 and 3 are, respectively, sectional views of the structure during the manufacture of the semiconductor device, subsequent to the step shown in FIG. 1. As shown in FIG. 2, a resist pattern covering regions other than the source region is formed over the main surface of the substrate 1 of FIG. 1, after which arsenic, for example, is ion implanted into the main surface of the substrate 1 through the mask of the resist pattern to form an n-type semiconductor region (second semiconductor region) 9 for the source on the surface layer of the semiconductor layer 1b between adjacent gate electrodes 7. Subsequently, an insulating film 10, that is made, for example, of silicon oxide or the like, is deposited over the main surface of the semiconductor layer 1b of the substrate (wafer) 1 by a CVD (Chemical Vapor Deposition) method, followed by formation of a photoresist pattern (hereinafter referred to as a resist pattern) thereon, so that the outer peripheral region of the power MIS-forming region is covered therewith, but others are exposed. In this condition, the insulating film 10 on the substrate 1 is etched back using an anisotropic dry etching technique to form the respective electrodes 7 at the power MIS-forming region and side walls (second insulating films) 10a at the side surfaces of the cap insulating films 8, along with an insulating film 10b being formed around the power MIS-forming region.

Subsequently, as shown in FIG. 3, the cap insulating films 8, side walls 10a and insulating film 10b are used as an etching mask to etch the exposed portions of the semiconductor layer 1b using a dry etching technique, so as to form grooves (second grooves) 11. The respective grooves 11 extend from the main surface of the semiconductor layer 1b to an intermediate position along the depth of the semiconductor region 2, as viewed in section, and they also extend along a given direction, as viewed in plane view. Thereafter, boron difluoride (BF$_2$), for example, is ion implanted into the semiconductor layer 1b at 80 keV and about $3\times10^{15}$ cm$^{-2}$, thereby forming a p$^+$-type semiconductor region (third semiconductor region) 12 at the bottom of the groove 11.

Figure 4:
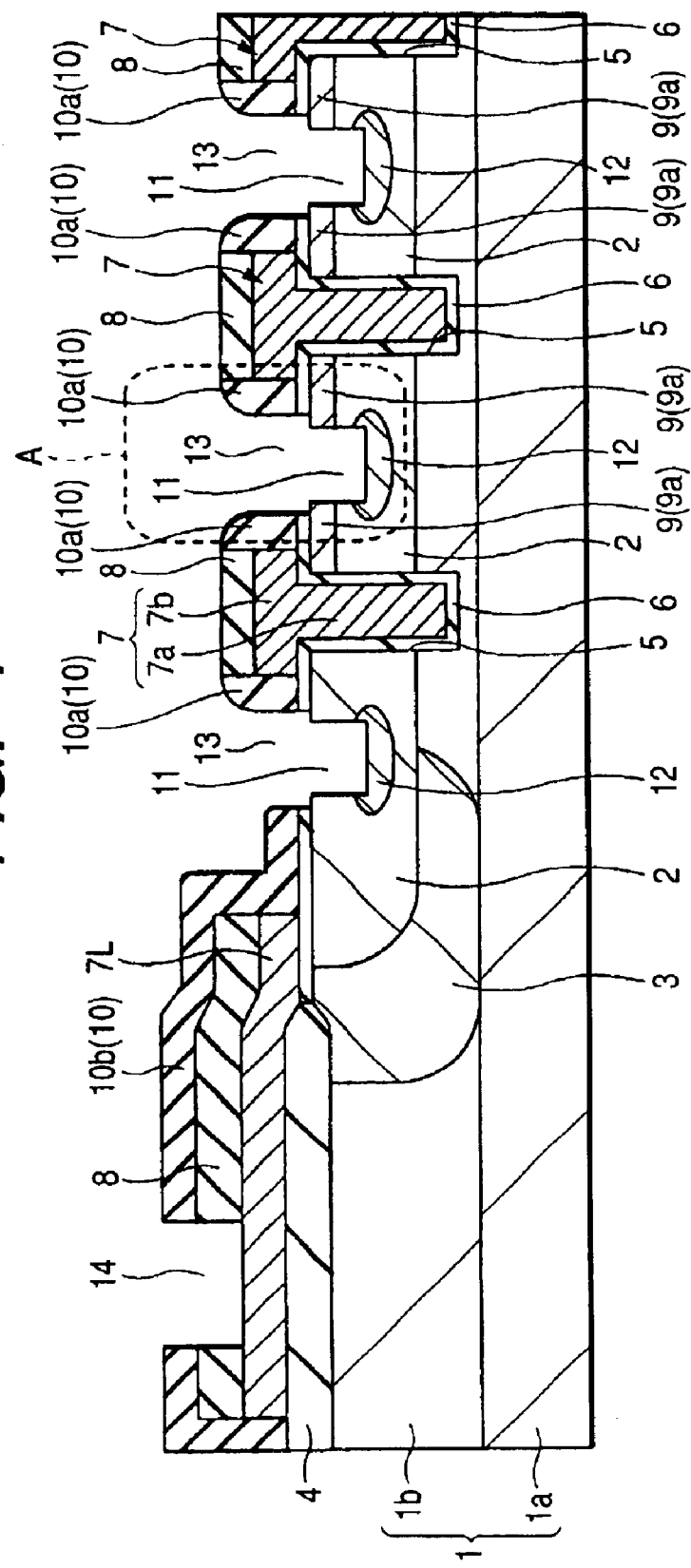
FIG. 4 is a sectional view of the structure during a step in the process of manufacture of the semiconductor device, subsequent to the steps of FIG. 3.
Figure 5:
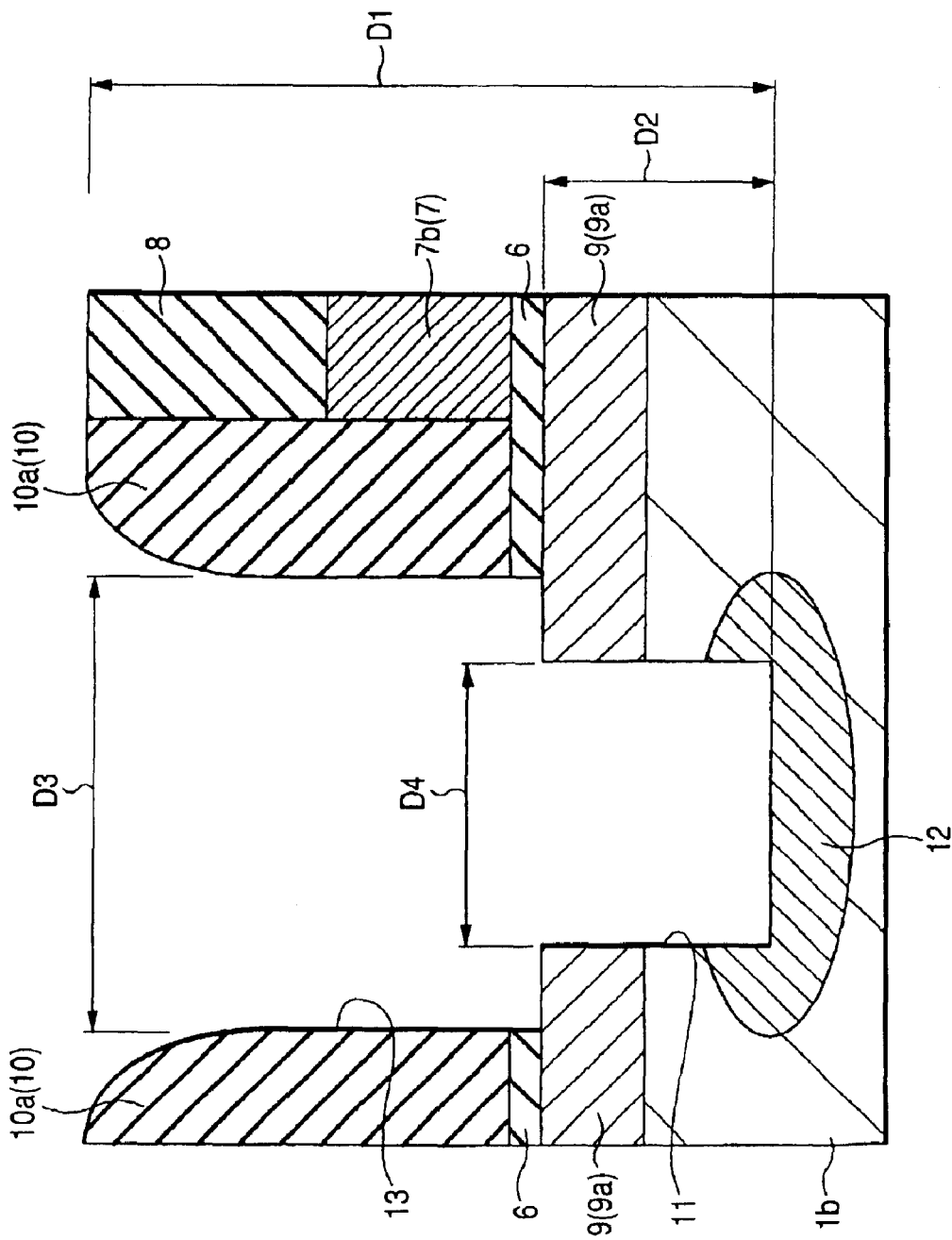
FIG. 5 is an enlarged, sectional view of the part A of FIG. 4.

FIG. 4 is a sectional view of the structure during the manufacture of the semiconductor device, subsequent to the step shown in FIG. 3. FIG. 5 is an enlarged, sectional view of region A in FIG. 4. In this step, the substrate 1 is subjected to wet etching to slightly etch the exposed surface portions of the insulating film 10 and the gate insulating film 6 in such a way that the side surface of the side wall 10a is recessed from the side surface of the groove 11. In this way, part of the main surface of the semiconductor layer 1b around the opening of the groove 11 is exposed. This contributes to an increase in the contact area between the source electrode and the semiconductor source region 9a. The above-mentioned etching permits a groove (second groove) 13 to be formed, which groove is located above and is wider than the groove 11 and runs into the groove 11.

As shown in FIG. 5, the total depth D1 of the grooves 11, 13 is, for example, about 1.2 μm, and the depth D2 of the groove 11 is, for example, 0.4 μm. The depth D3 of the groove 13 is, for example, about 0.8 μm, and the width D4 of the groove 11 is, for example, about 0.5 to 0.6 μm. In this connection, however, the wiring formation method of Embodiment 1, as described hereinafter, may also be applied to the case where no etching is carried out for the purpose of the formation of the groove 13, i.e., the case of a structure wherein the groove 13 is so arranged that its width is not larger than, but is equal to that of, the groove 11. After completion of the etching, ordinary photolithographic and dry etching techniques using a resist pattern as a mask are performed to form a contact hole 14, so that part of the extrinsic gate wiring 7L is exposed at the insulating film 10b and the cap insulating film 8.

Such grooves 11, 13 as formed in the power MIS are, respectively, larger in width than a typical contact hole or through-hole of a semiconductor device having an ordinary logic circuit or memory circuit, with the tendency that the aspect ratio increases owing to a reduction in size between adjacent cells accompanied by the requirement for improving the degree of integration of the cells of a power MIS. In order to bury such relatively great, deep grooves 11, 13 with an aluminium (Al) film, it is desirable to raise the reflow temperature after or during deposition of the aluminium film. Nevertheless, if the reflow temperature increases, and in particular, if it exceeds 400° C., the reaction between the aluminium used as a wiring material and the silicon in the substrate 1 proceeds, with the attendant problem that a junction failure takes place at the channel portion of the power MIS. On the other hand, there is a problem as to how the grooves 11, 13, respectively, can be buried in a spacefree, continuous condition so as to lower the ON resistance (i.e. ON resistance between the source electrode and the drain electrode) of the power MIS. To cope with this problem, the following procedure is performed according to Embodiment 1.

Figure 6:
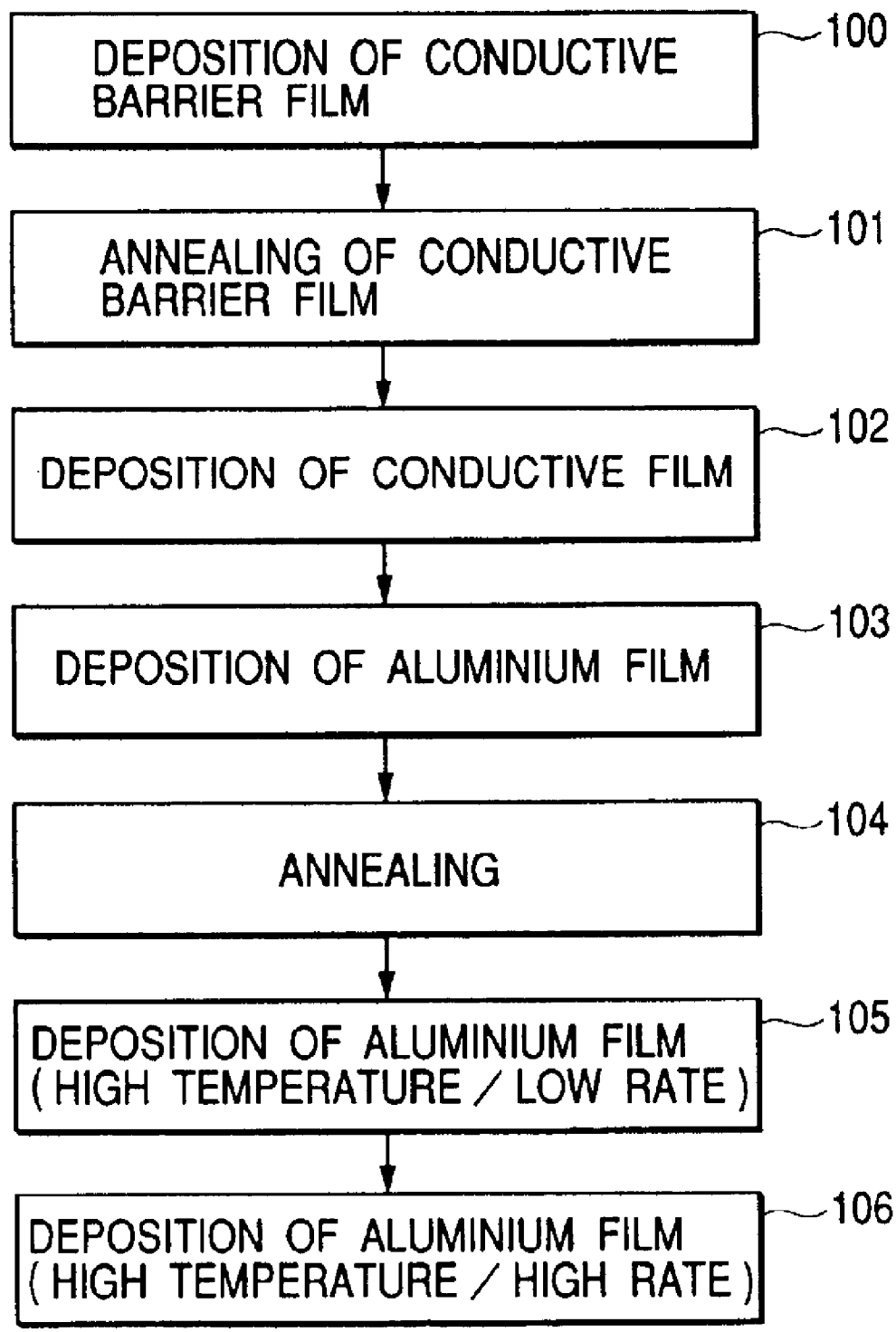
FIG. 6 is a flowchart of the process for burying a groove formed in the manufacture of the semiconductor device of FIG. 4.

FIG. 6 is a flow chart of the process for burying the grooves 11, 13. FIGS. 7 to 13, respectively, are enlarged, sectional views showing a portion corresponding to the region A of FIG. 4 in the course of the manufacture of the semiconductor device, according to the respective steps of the flow chart of FIG. 6.

Figure 7:
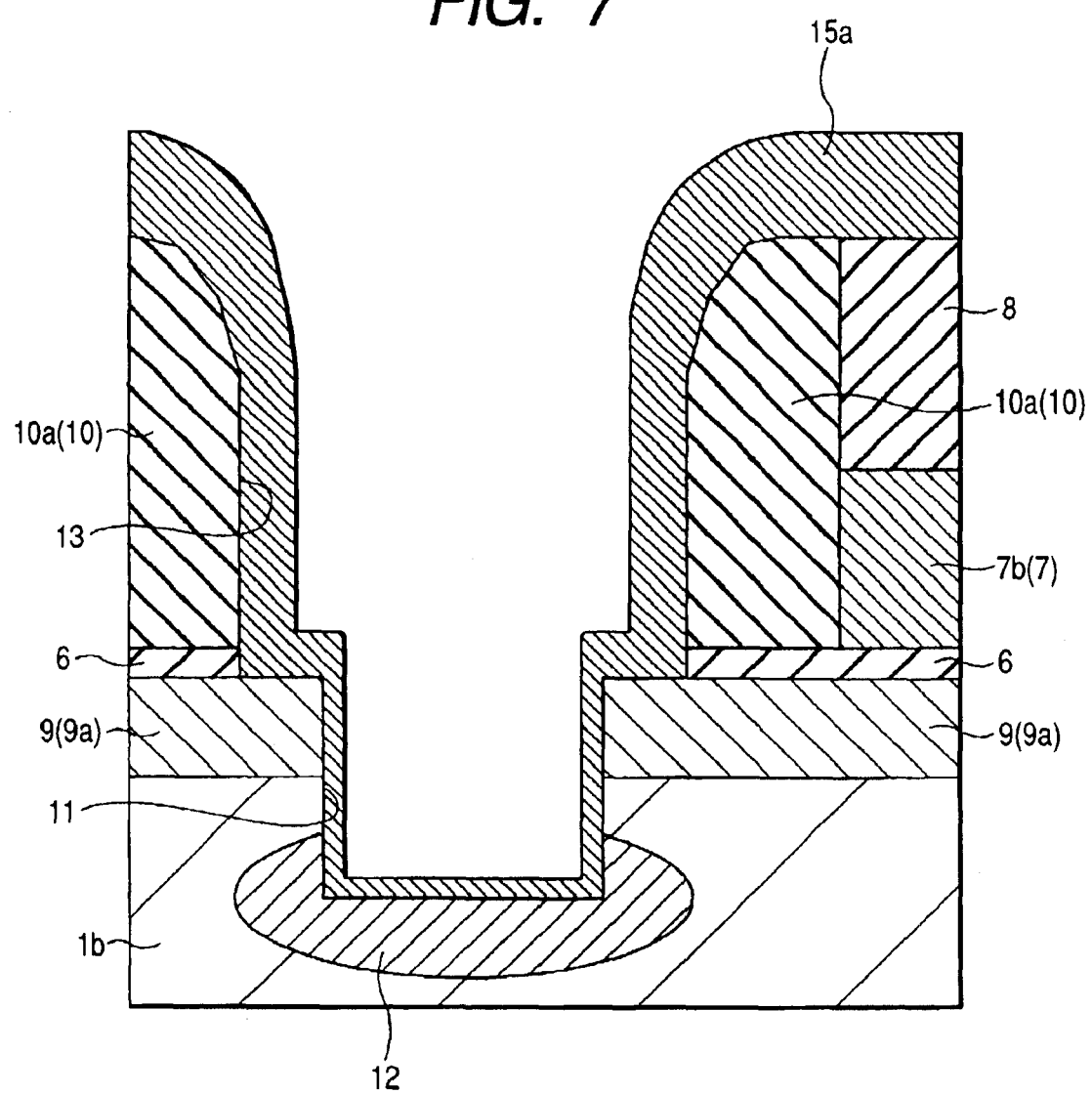
FIG. 7 is an enlarged, sectional view of the part A in the course of manufacture of the semiconductor device, subsequent to the step of FIG. 4.

As shown in FIG. 7, a conductor film (first conductor film) 15a is deposited on the main surface of the substrate (wafer) 1 (step 100 in FIG. 6). This permits a thin conductor film 15a to be deposited on the inner surfaces (inner wall surfaces and bottom surface) of the grooves 11, 13 and the contact hole 14 (see FIG. 4), so that the grooves 11, 13 and the contact hole 14 are not buried completely. This conductor film 15a has a barrier function for suppressing or preventing the aluminium used as a main wiring material, as will be described hereinafter, from diffusing into the aluminium film side, and it also prevents the silicon of the semiconductor layer 1b from diffusing into the side of the aluminium film used as the main wiring material. Especially, in Embodiment 1, if the reflow of aluminium, as will be described hereinafter, is carried out at high temperatures, for example, 400° C. or over, the conductor film 15a is considered to provide a structure (from the aspects of material, thickness, function and the like) that is capable of suppressing or preventing a reaction from occurring between the aluminium used as a main wiring material and the silicon in the semiconductor layer 1b.

According to our studies, it has been found that where titanium (Ti) is selected as a material for the conductor film 15a, the resultant titanium film is converted to a silicide thereof substantially entirely along the thickness direction thereof when subjected to annealing after the deposition thereof. Eventually, when aluminium used as a main wiring material is deposited and subjected to reflow treatment at high temperatures (400° C. or over), the reaction between the aluminium and the silicon proceeds, thus leading to a junction leakage failure at the channel portion of power MIS. In order to suppress or prevent a reaction from occurring between the aluminium and the silicon, as mentioned above, the conductor film 15a should be made of a high heat resistance material, which is not converted into a suicide entirely along the thickness of the conductor film 15a by annealing subsequent to the deposition of the conductor film 15a. In other words, the conductor film 15a is so selected as to provide a structure wherein the silicide layer is formed only at a portion in contact with the semiconductor layer 1b; and, thus, the conductor film 15a is interposed between the silicide layer and the aluminium film that is used as a main wiring material in order to prevent direct contact between the silicide layer and the aluminium that is used as a main wiring material. In this manner, if the thermal treatment temperature of the aluminium that is used as a main wiring material, as will be described hereinafter, is made high, the reaction between the aluminium and the silicon in the substrate 1 can be suppressed or prevented by means of the conductor film 15a. Accordingly, the main wiring material of aluminium can be thermally treated at high temperatures, and, thus, the grooves 11, 13 can be buried with aluminum in an efficiently improved manner.

As a specific material for the conductor film 15a, a number of materials could be selected, of which titanium tungsten (TiW) is most preferred. Titanium tungsten has favorable properties in that it exhibits a low reactivity with silicon, is thermally stable and low in heat resistance, and is low in contact resistance and electrical resistance, because this material is a kind of metal. Where titanium tungsten is selected as a material for the conductor film 15a, its thickness is, for example, at about 200 nm. It will be noted that the "thickness" of the conductor film 15a refers to a design thickness (which is substantially equal to the thickness of the conductor film 15a that is deposited on the upper surface of the cap insulating film 8 and the insulating film 10b). The thickness of the conductor film 15a attached on the side walls and the bottom surfaces of the grooves 11, 13 becomes smaller than the design thickness (of about 200 nm) (the term "design thickness" used hereinafter has the same meaning as set out above).

Other types of materials for the conductor film 15a include, for example, high-melting metals, such as tungsten (W), tantalum (Ta) and the like. In this case, they are high in heat resistance and are low in contact and electrical resistances, because of the nature of the metal thereof. Further types of materials for the conductor film 15a include, for example, high melting metal nitride films, such as a titanium tungsten nitride film (TiWN), a tungsten nitride film (WN), a tantalum nitride film (TaN) and the like. Still further types of materials for the conductor film 15a include, for example, tungsten silicide ($WSi_2$) and a nitride thereof (WSiN). Where tungsten silicide ($WSi_2$) or its nitride (WSiN) is selected, silicon is present in the conductor film 15a. The bonding between tungsten and silicon is stronger than the bonding between aluminium and silicon, so that the reactivity between aluminium and silicon becomes low. As a result, substantially similar effects are obtained as in the case where titanium tungsten is selected. Using such materials as indicated above or other types of materials as the conductor film 15a, proper control of the thickness of the conductor film 15a may cause such action and effect as set out hereinabove.

Figure 8:
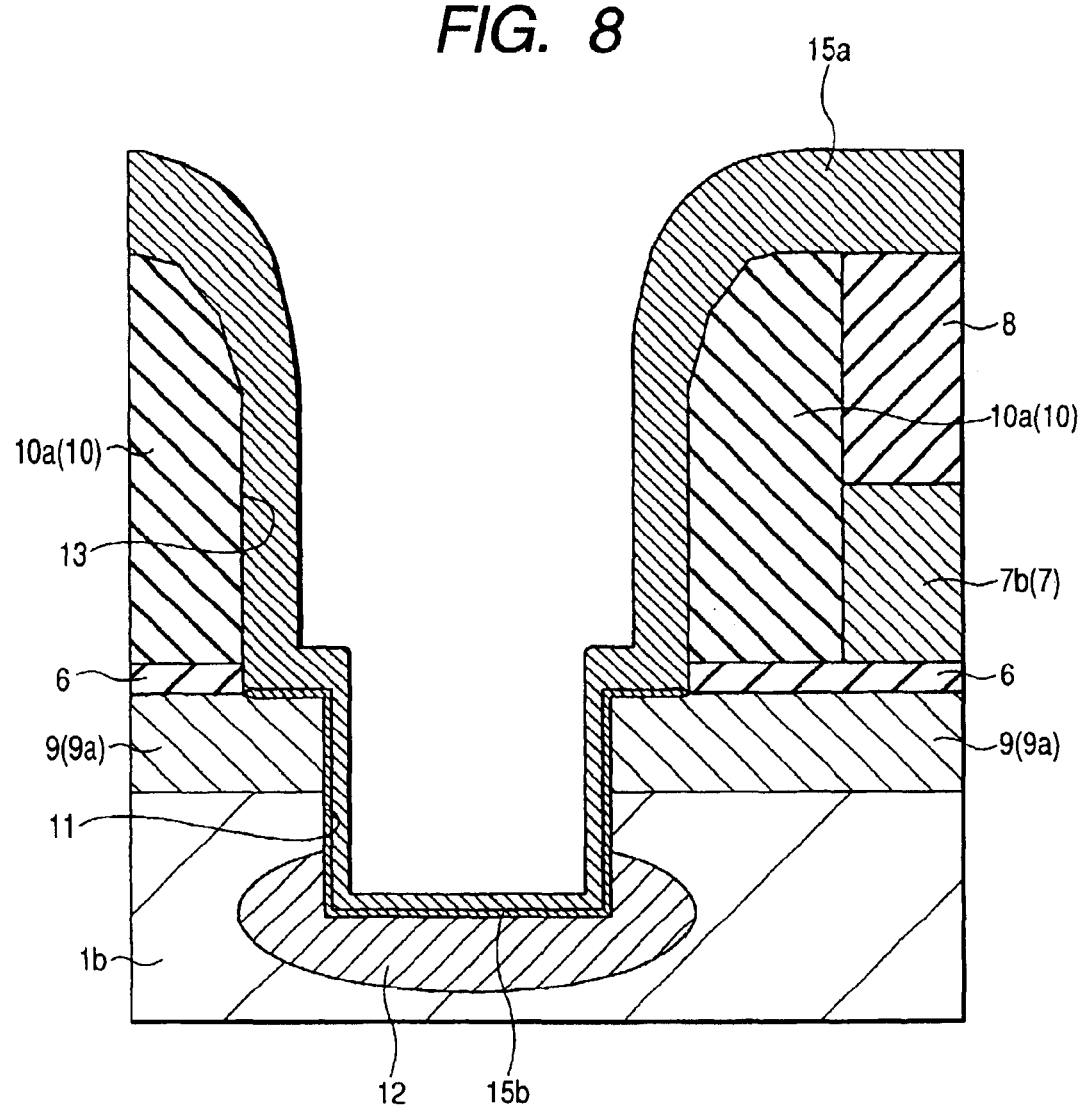
FIG. 8 is an enlarged, sectional view of the part A in the course of manufacture of the semiconductor device, subsequent to the step of FIG. 7.

Next, the substrate (wafer) 1 is annealed in an atmosphere of an inert gas, such as, for example, nitrogen gas ($N_2$) or the like, at 650° C. for about 30 minutes (step 101 in FIG. 6). As shown in FIG. 8, this permits a very thin silicide layer (compound layer) 15b, that is made, for example, of titanium silicide ($TiSi_2$) or the like, to be formed at the interface of the contact surface of the conductor film 15a with the semiconductor layer 1b and the extrinsic gate wiring 7L (see FIG. 4).

In Embodiment 1, the conductor film 15a is not wholly converted to a silicide, as mentioned above, but the silicide layer 15b is formed only at the interface portion of contact between the conductor film 15a and the semiconductor layer 1b, with the conductor layer 15b being left at the upper layer or portion thereof. The contact resistance between the source electrode and the semiconductor region for the source, to be described hereinafter, can be reduced through the formation of such a silicide layer 15b, thus enabling the ON resistance of the power MID to be reduced. This treatment likewise can be carried out for the case where the conductor film 15a is made of a material other than titanium tungsten. In this case, a silicide layer is formed only at a contact portion between the conductor film 15a and the semiconductor layer 1b, like the case using titanium tungsten, with the conductor film 15a being left at an upper layer relative to the silicide layer.

Figure 9:
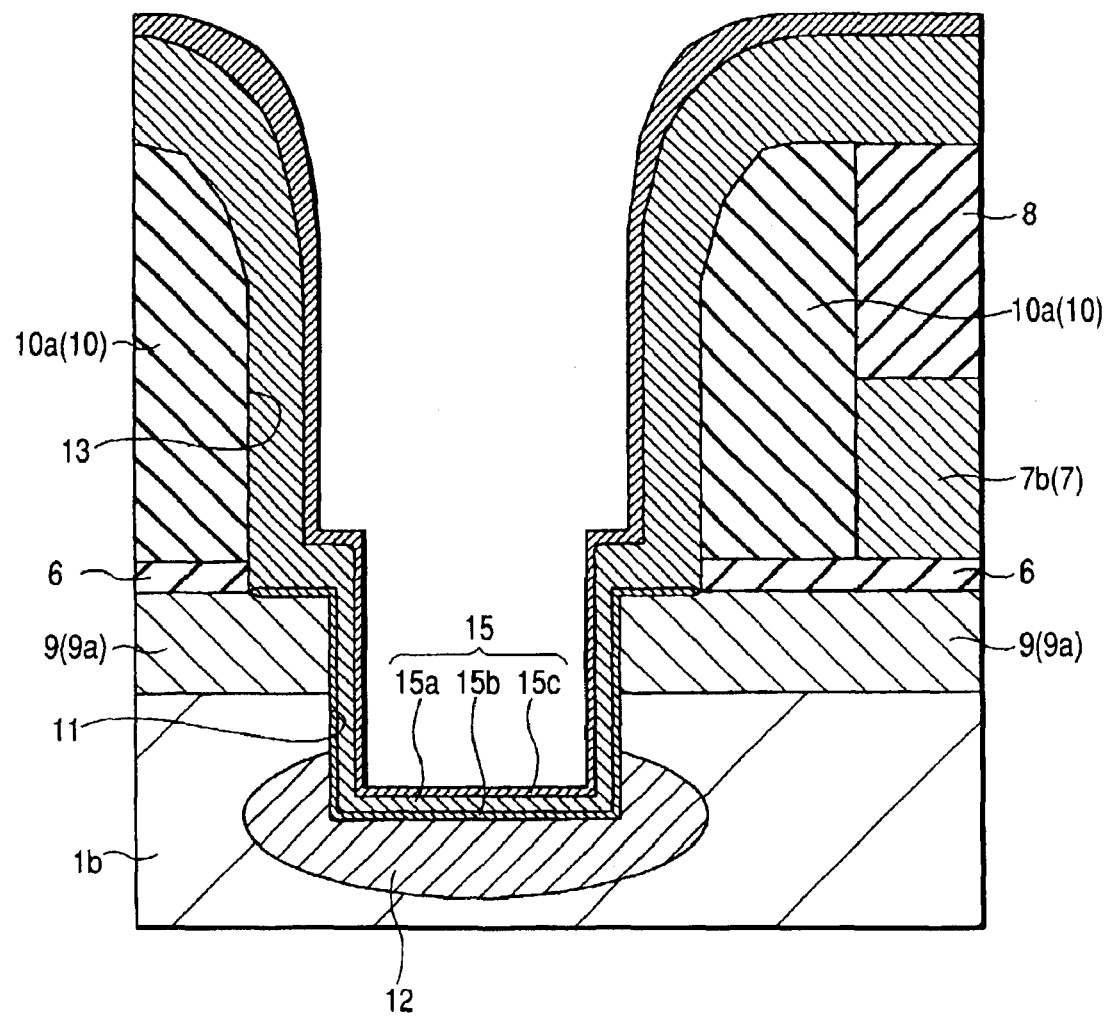
FIG. 9 is an enlarged, sectional view of the part A in the course of manufacture of the semiconductor device, subsequent to the step of FIG. 8.

Subsequently, as shown in FIG. 9, a conductor film (second conductor film) 15c made of a high-melting metal film, such as titanium (Ti) or the like, is deposited, for example, to a design thickness of about 50 nm by a sputtering method (see step 102 in FIG. 6). In doing so, the conductor film 15c is so attached as to cover the surface of the conductor film 15a at the inner surface (including the inner wall surfaces and bottom surfaces) of the grooves 11, 13 and the contact hole 14 without fully burying the grooves 11, 13 and the contact hole 14 (see FIG. 4) therewith. This conductor film 15c has the functions of improving the wettability of an aluminium film to be subsequently deposited and suppressing or preventing aluminium and silicon from reacting with each other. The conductor film 15 formed of the above-stated conductor films 15a, 15b, 15c is an auxiliary wiring material for forming the gate electrode and the source electrode of the power MIS.

Figure 10:
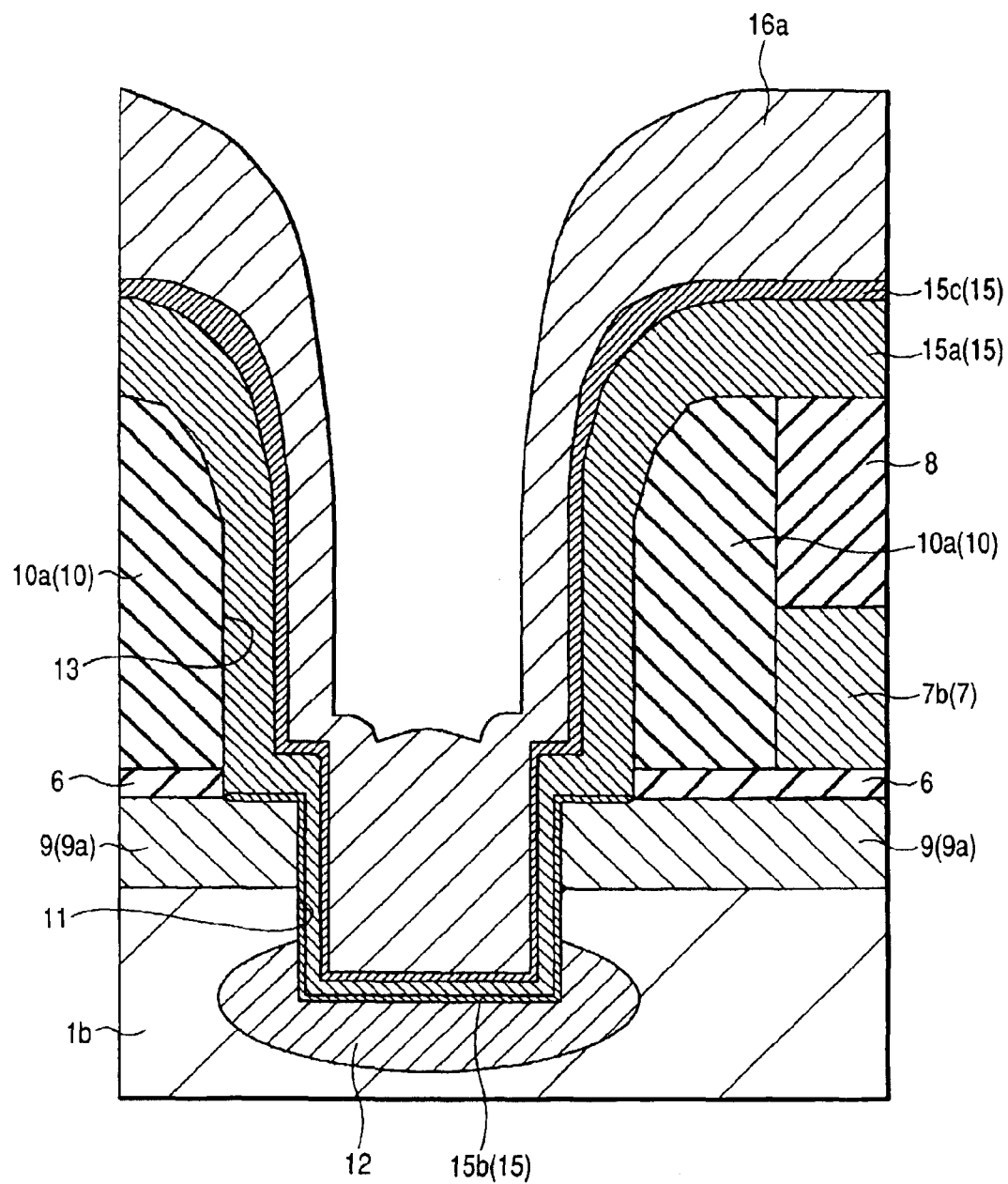
FIG. 10 is an enlarged, sectional view of the part A in the course of manufacture of the semiconductor device, subsequent to the step of FIG. 9.

Next, as shown in FIG. 10, a conductor film that is made, for example, of aluminium (an aluminium-based conductor film made mainly of aluminium or a first aluminium-based conductor film made mainly of aluminium) 16a is deposited on the main surface of the substrate (wafer) 1 by a sputtering method (step 103 in FIG. 6). This conductor film 16a serves as an underlying film having the function of ensuring the continuity of an aluminium film to be formed in a subsequent deposition procedure of hot aluminium, and it is formed as a film at a low temperature (e.g. a normal temperature: 30° C.).

More particularly, when an aluminium film is deposited, under high temperature conditions, on the conductor film 15c that is made of titanium or the like, small lumps of aluminium are formed on the surface of the conductor film 15c, thus not ensuring the continuity of the aluminium film. In order to establish the continuity of an aluminium film, a conductor film 16a that is made of an aluminium film is formed under low temperature conditions prior to the formation of an aluminium film under high temperature conditions.

The thickness of the conductor film 16a is at a level sufficient to bury the groove 11 of a relatively small width, and, more particularly, at such a level that the portion of the conductor film 15c is not exposed at the corner (i.e. a portion formed at the intersection between the main surface of the semiconductor layer 1b and the side surface of the groove 11) of the semiconductor layer 1b around the opening of the groove 11. This is provided for the reason that, if part of the conductor film 15c is exposed, the continuity of a subsequently deposited aluminium film cannot be ensured. The design thickness of the conductor film 16a formed in this way is, for example, at about 400 nm. At this stage, the conductor film 16a is in such a state as to be attached through the thin conductor films 15a, 15b, 15c on the inner surfaces (i.e. the inner wall surfaces and bottom surfaces) of the grooves 11, 13 and the contact hole 14 without completely burying the groove 13 and the contact hole 14 (FIG. 4) therewith.

Figure 11:
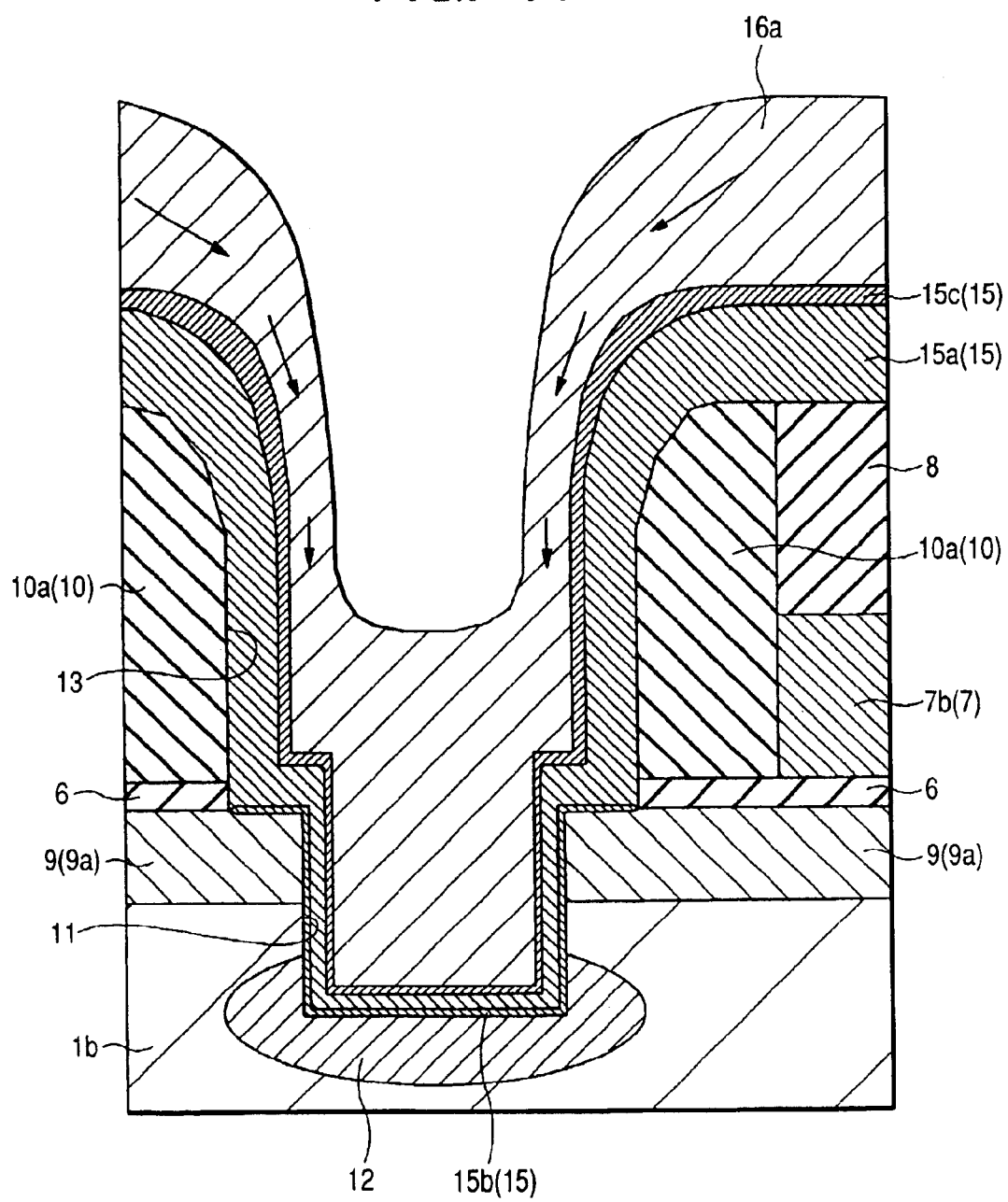
FIG. 11 is an enlarged, sectional view of the part A in the course of manufacture of the semiconductor device, subsequent to the step of FIG. 10.

After the deposition of the conductor film 16a, the substrate (water) 1 is annealed, as shown in FIG. 11, within a sputtering apparatus wherein the conductor film 16a has been deposited, thereby causing the conductor film 16a to be made to reflow (see step 104 in FIG. 6). In this manner, the conductor film 16a is made to flow and run into the grooves 11, 13. At this stage, the annealing temperature is set at a temperature, for example, that is higher than about 400° C., in Embodiment 1. More particularly, annealing is carried out, for example, at 450° C. for several minutes. This enables the reflow property of the aluminium to be improved. More particularly, a great quantity of aluminium is charged or caused to run into the grooves 11, 13, which are fine and have a high aspect ratio, thereby burying the grooves 11, 13 satisfactorily. This permits the electrical resistance within the grooves 11, 13 to be reduced and thus, the ON resistance of the power MID can be reduced, making it possible to improve the performance of the power MIS.

As stated hereinabove, in Embodiment 1, the conductor 15a is formed so that even if the annealing temperature is set at a level, for example, of higher than 400° C., the reaction between the aluminium and the silicon in the semiconductor layer 1b can be suppressed or prevented. Thus, the occurrence of junction failure at the channel portion of the power MIS ascribed to the reaction can be suppressed or prevented, with the possibility of improved yield and increased reliability of the power MIS.

Figure 12:
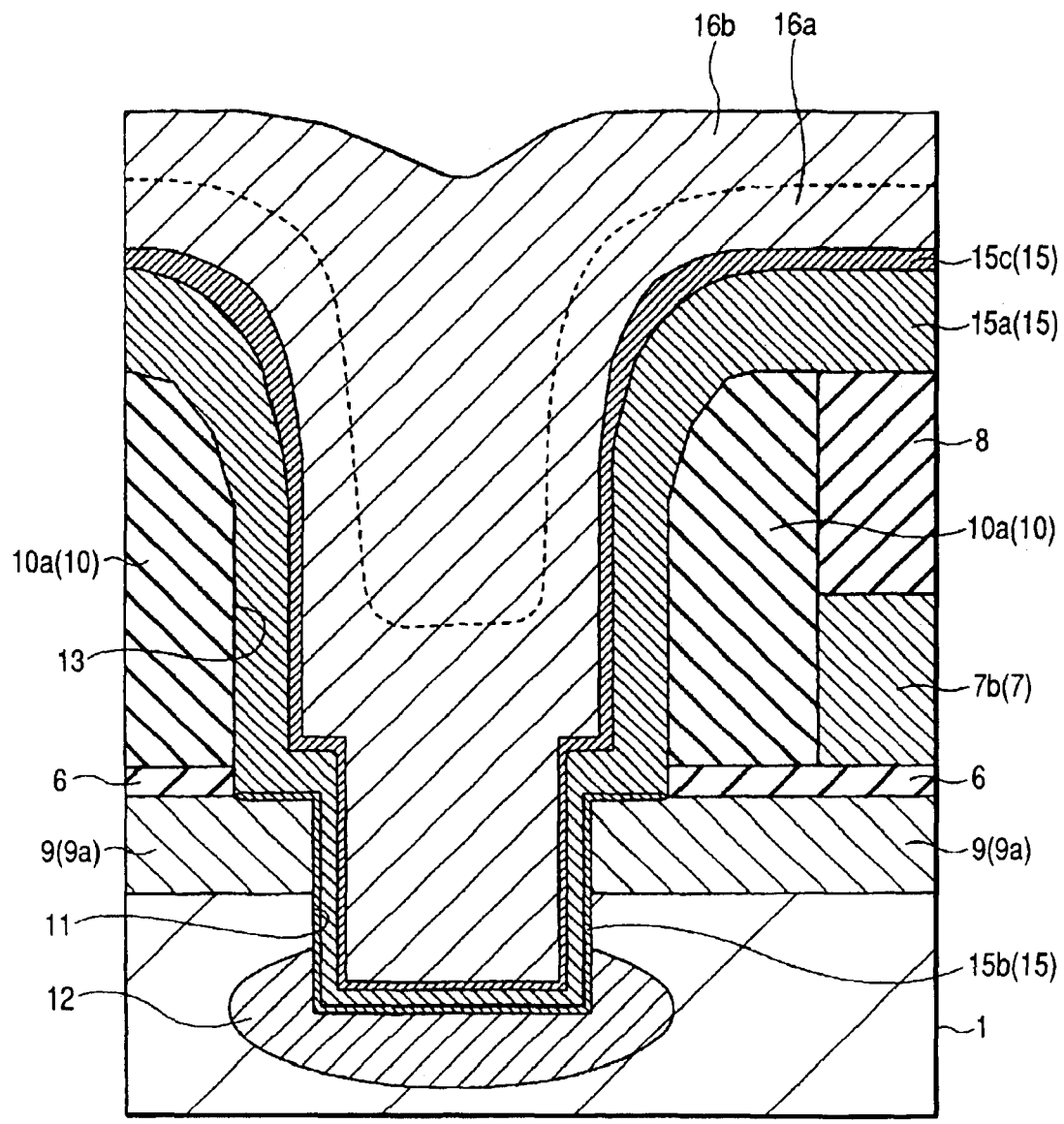
FIG. 12 is an enlarged, sectional view of the part A in the course of manufacture of the semiconductor device, subsequent to the step of FIG. 11.

At this stage, the conductor film 16a does not completely bury the grooves 11, 13 and the contact hole 14 (see FIG. 4) therewith, but is in a state of being attached to the inner surfaces (i.e. the inner wall surfaces and bottom surfaces) of the grooves 11, 13 and the contact hole 14 through the thin conductor films 15a, 15b, 15c. A recess is left at the upper surface of the conductor film 16a within the groove 13. Thereafter, a conductor film (second aluminium-based conductor film) 16b made, for example, of aluminium or the like is deposited, as shown in FIG. 12, by a sputtering method at a low rate within the same sputtering apparatus as used for the deposition of the conductor film 16a (step 105 in FIG. 6). At this time, the conductor 16b is deposited while heating the substrate (wafer) 1 from the back side thereof (so-called heat sputtering). In this way, the conductor films 16a, 16b flow and run into the grooves 11, 13. The heating temperature is set, for example, at a level of higher than 400° C., and, more particularly, at a temperature as high as about 450° C. Eventually, a similar effect as in the case of the conductor film 16a can be obtained.

The deposition rate of the conductor film 16b should be lower than the deposition rate of an aluminium film to be subsequently deposited. This is because the recessed portion in the groove 13 is well buried with the conductor film 16b, while ensuring the continuity of the conductor film 16b. The deposition rate of the conductor film 16b is, for example, 0.4 μm per unit time (of about several minutes). The design thickness of the conductor film 16b that is deposited at this stage is about half of the width D3 (see FIG. 5) of the groove 13, and it is particularly, for example, about 400 nm. This permits the remaining recess in the groove 13 to be substantially completely buried with the conductor film 16b. It will be noted that, although a boundary line between the conductor films 16a, 16b is indicated by a broken line in FIG. 12, this indication is provided only for the sake of ease in viewing the drawing, and such a boundary line Is not actually formed.

Figure 13:
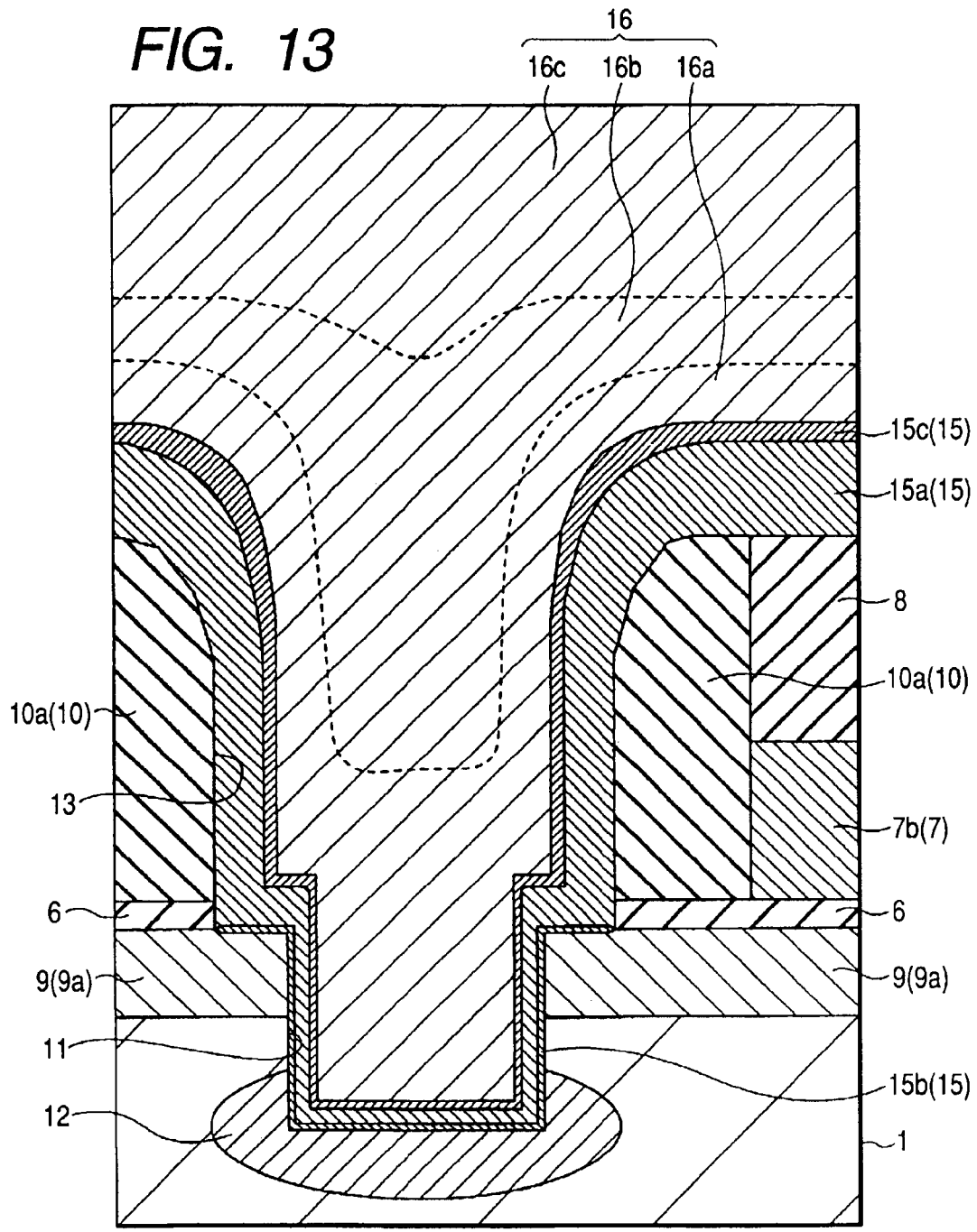
FIG. 13 is an enlarged, sectional view of the part A in the course of manufacture of the semiconductor device, subsequent to the step of FIG. 12.

Thereafter, as seen in FIG. 13, a conductor film (second aluminium-based conductor film) 16c, that is made, for example, of aluminium or the like, is deposited on the main surface of the semiconductor substrate (wafer) 1 at a high rate according to a sputtering method within the same sputtering apparatus as used for the deposition of the conductor film 16b (step 106 in FIG. 6). In this case, the conductor film 16c is deposited while heating the substrate (wafer) 1 from the back side thereof. The heating temperature is set, for example, at a level of higher than 400° C., and, it is particularly, for example, about 450° C. In this way, similar effects as in the case of the conductor films 16a, 16b can be obtained.

The deposition rate of the conductor film 16c is made higher than the deposition rate of the conductor film 16b. This is for the reason that, at this stage, the groove 13 is substantially completely buried with the conductor film 16b, so that priority is put on the shortage in deposition time of the aluminium film over the burying property and continuity of the groove being ensured, thereby improving the throughput. The deposition rate of the conductor film 16c is, for example, about 4.1 μm per unit time (of about several minutes, which is the same as the unit time for the deposition rate of the conductor film 16b). The thickness of the conductor film 16c deposited that is deposited at this time should be sufficient to lower the ON resistance of the power MIS and is particularly as thick as about 4.1 μm, for example.

The conductor film formed of the thus deposited conductor films 16a, 16b, 16c, each made mainly of aluminium, is used as the afore-mentioned main wiring material for forming gate and source electrodes. At this stage, the grooves 11, 13 and the contact hole 14 (see FIG. 4) are, respectively, buried with the conductor film 16 to a full extent.

According to this Embodiment 1, the aluminium-based conductor film 16 that is made mainly of aluminium can be buried in the grooves 11, 13, which are greater in size than the grooves or holes typically formed in ordinary semiconductor devices, and, thus, they have a high aspect ratio, in a space-free condition and can also be deposited so as to be thick in the state of ensuring continuity. This enables the ON resistance of the power MID to be lowered, thus permitting a great current to pass without exceeding the maximum power loss (drain loss) at a specified reference point temperature. Thus, the performance and reliability of the semiconductor device can be improved.

If the grooves 11, 13 are microfabricated, such grooves 11, 13 can be well buried with the conductor film 16. Thus, the microfabrication of the grooves 11, 13 can be promoted, and the degree of integration of the cells of the power MIS can be improved. Accordingly, the number of cells formed in a power MIS per unit area can be increased, thus leading to an improved capacity of the semiconductor device. It will be noted that, although boundary lines of the conductor films 16a, 16b, 16c are, respectively, indicated by a broken line in FIG. 13, such indication is provided only for the sake of ease in viewing the drawing, and these boundary lines are not formed actually.

Figure 14:
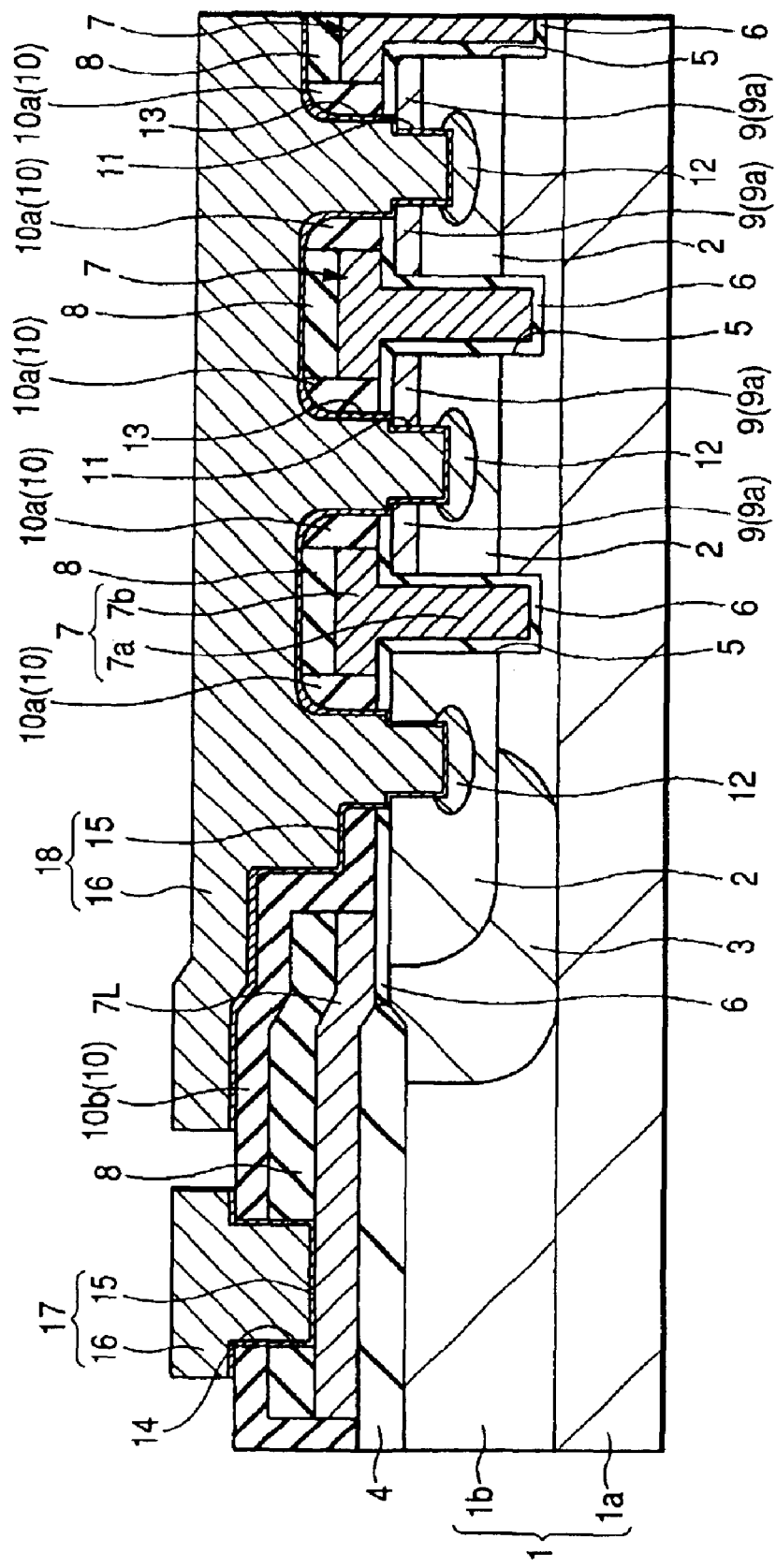
FIG. 14 is an enlarged, sectional view of the structure during a step in the process of manufacture of the semiconductor device, subsequent to the step of FIG. 13.

FIG. 14 is a sectional view of the structure in the manufacture of the semiconductor device, subsequent to the step shown in FIG. 13. In this step, the conductor films 16, 15 are, respectively, patterned by ordinary photolithographic and dry etching techniques to form a gate electrode 17 and a source electrode 18, each having the conductor films 16, 15, on the main surface of the substrate 1. The gate electrode 17 is electrically connected to the extrinsic gate wiring 7L via the contact hole 14, and the source electrode is electrically connected to the semiconductor regions 2, 9, 12 of the semiconductor layer 1b via the grooves 13, 11.

After deposition of a surface protective film on the main surface of the substrate 1, a bonding area thereof is removed by etching to form a bonding pad. Thereafter, the substrate (wafer) 1 is polished on the back surface thereof, and a drain electrode is formed at the back surface. Subsequently, a semiconductor device having a power MIS is manufactured through an ordinary assembling procedure of the semiconductor device. This power MIS is so arranged that, in a state where a positive voltage is applied to the drain electrode and a ground voltage (0 V) is applied to the source electrode 18, the power MIS commences to work when a positive voltage is applied to the gate electrode 17 from a state where the gate electrode 17 has been supplied with the ground voltage and, thus, does not work. When a positive voltage is applied to the gate electrode 17, an inversion layer (n-channel) is formed in the $p^-$-type semiconductor region 2, under which the n-type semiconductor region 9 for the source and the semiconductor layers 1a and 1b for the drain are connected through the inversion layer. As a result, electrons pass from the source electrode 18 to the drain electrode at the back surface of the substrate 1 via the n-type semiconductor region 9, inversion layer, semiconductor layer 1b and semiconductor layer 1a on the main surface of the substrate 1. More particularly, an electric current passes from the drain electrode to the source electrode 18, so that the power MIS is turned on. In this way, the drain current of the power MID runs along the thickness of the substrate. On the other hand, when the gate voltage is changed from a positive voltage to a ground or negative voltage, the above-mentioned inversion layer disappears, so that no electric current passes between the n-type semiconductor region 9 and the semiconductor layers 1a, 1b, rendering the power MIS off.

(Embodiment 2)

Figure 15:
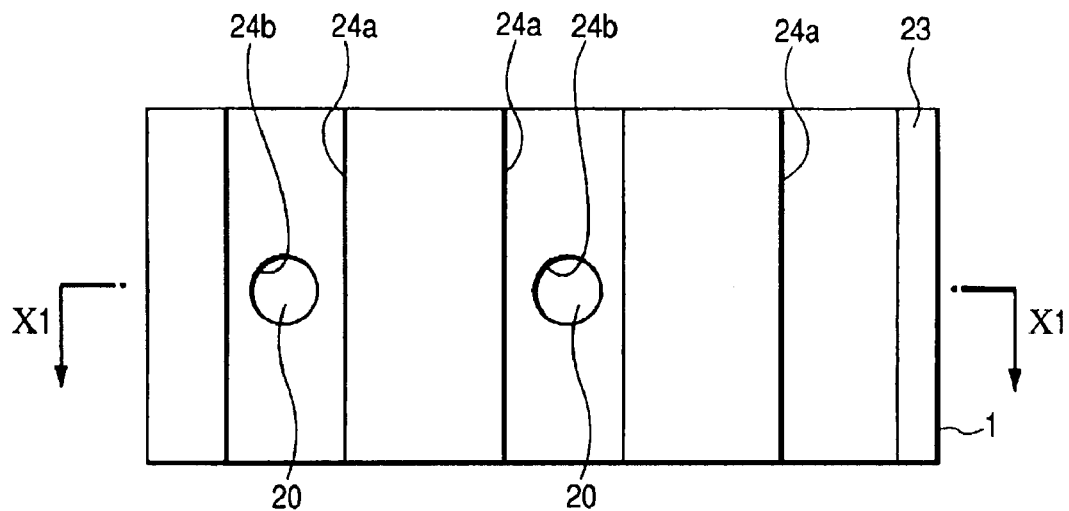
FIG. 15 is a top plan view of the structure during a step in the process of manufacture of a semiconductor device according to another embodiment of the invention.
Figure 16:
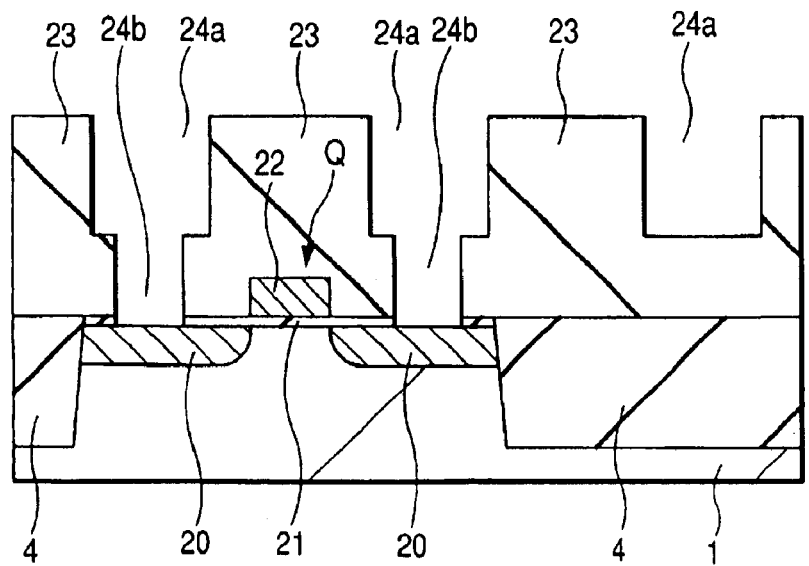
FIG. 16 is a section, taken along the line X1—X1 of FIG. 15.
Figure 17:
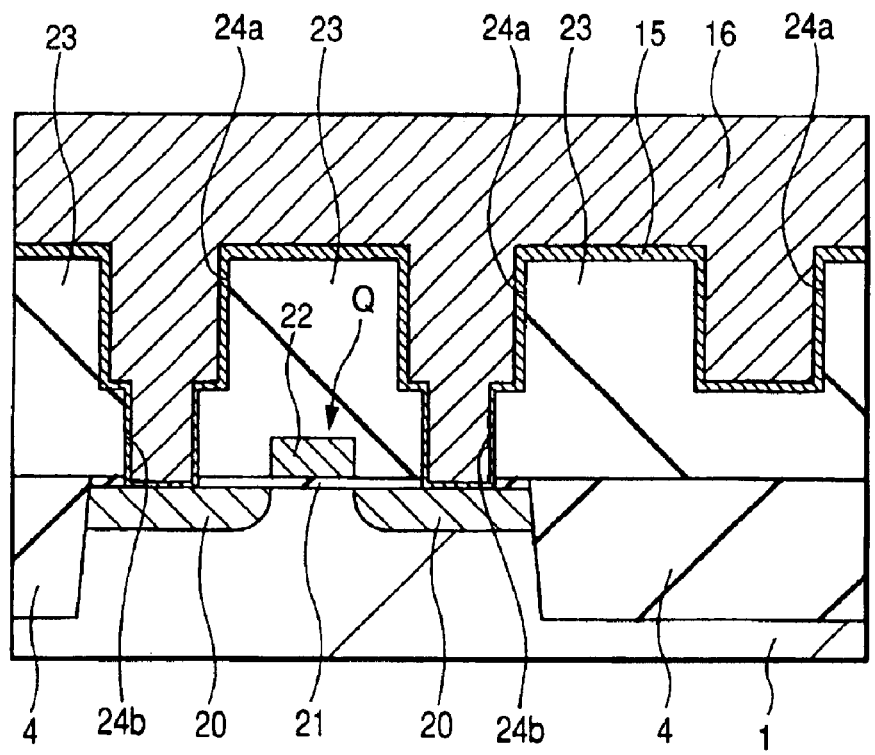
FIG. 17 is an enlarged, sectional view of the structure during a step in the process of manufacture of the semiconductor device, subsequent to the step of FIG. 16.
Figure 18:
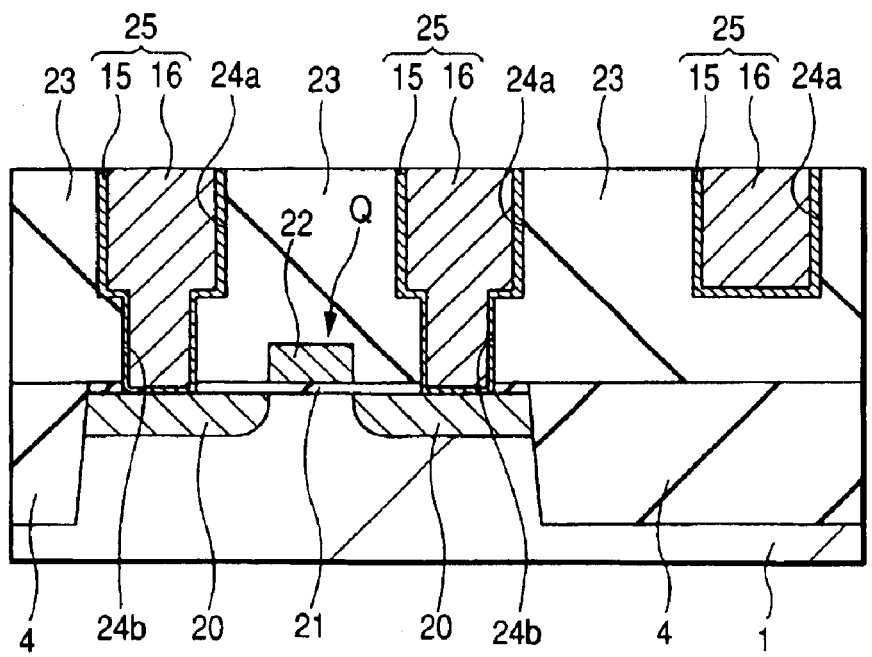
FIG. 18 is an enlarged, sectional view of the structure during a step in the process of manufacture of the semiconductor device, subsequent to the step of FIG. 17.

In Embodiment 2, an application to a Damascene wiring formation technique is illustrated with reference to FIGS. 15 to 18. FIG. 15 is a plan view of the structure in the manufacture of a semiconductor device of Embodiment 2, and FIG. 16 is a section taken along the line X1—X1 in FIG. 15. FIGS. 17 and 18 are, respectively, a sectional view of the device at a portion corresponding to the line X1—X1 of FIG. 15 in the course of the manufacture of the semiconductor device subsequent to the step shown in FIG. 16.

As shown in FIGS. 15 and 16, a MISFET (hereinafter referred to simply as MIS) Q is formed, for example, at an active region surrounded by an isolation portion 4 on the main surface of a substrate (wafer) 1. The substrate 1 is not made of an epitaxial wafer, but is made of an ordinary semiconductor wafer. The isolation portion 4 has a so-called trench isolation structure, wherein it is formed by burying an insulating film in a groove made in the main surface of the substrate 1. MIS Q has source and drain semiconductor regions 20 formed in the main surface of the substrate 1, a gate insulating film 21 formed on the main surface of the substrate 1, and a gate electrode 22 formed thereon.

The semiconductor region 20 is formed by introducing, for example, arsenic (As) or phosphorus (P), if MIS Q is an n-channel device, and it is formed by introducing, for example, boron (B) or boron difluoride ($BF_2$) for a MIS Q that is a p-channel device. The gate insulating film 21 is made, for example, of a silicon oxide film, a silicon oxynitride film or a builtup structure of a silicon oxide film and a silicon nitride film. The gate electrode 22 is made, for example, of a single film structure of a polysilicon film of low resistance, a so-called polycide structure wherein a silicide film is formed on a low resistance polysilicon film, or a so-called polymetal structure wherein a metal film is provided on a low resistance polysilicon film through a barrier conductor film.

The substrate 1 has deposited, on the main surface thereof, an insulating film made, for example, of a silicon oxide film, so as to cover the MIS Q therewith. This insulating film 23 is formed with a wiring groove (opening for wiring) 23a and a contact hole (opening for wiring) 24b reaching the main surface of the substrate 1 from the bottom. As viewed in plane view, as shown in FIG. 15, the wiring groove 24a is formed as a band-shaped pattern extending in vertical directions of FIG. 15. On the other hand, as viewed in section, as shown in FIG. 16, the groove 24a is formed as a rectangular groove having a depth extending to an intermediate position along the thickness of the insulating film 23. The contact hole 24b, as viewed in plane view, as shown in FIG. 15, is formed as a circular pattern whose diameter is smaller than the width (minor size) of the wiring groove 24a, and part (part of the semiconductor regions 20 for source and drain) of the main surface of the substrate 1 is exposed from the bottom of the contact hole 24b. As viewed in section, as shown in FIG. 16, the contact hole 24b is formed in such a state as to extend from the bottom surface of the wiring groove 24a to the main surface of the substrate 1.

As shown in FIG. 17, a conductor film 15 and a conductor film 16 are successively deposited in order from the lower layer on the main surface of the substrate 1 in the same manner as in the foregoing Embodiment 1. The conductor films 15, 16 are arranged in the same manner as in Embodiment 1. In Embodiment 2, the conductor film 16 can be well buried in the wiring groove 24a and the contact hole 24b in a space-free condition, like Embodiment 1, and deposited while ensuring the continuity thereof. Subsequently, additional conductor films 16, 15 are, respectively, polished by a chemical mechanical polishing (CMP) method, thereby forming a buried wiring 25 having the conductor films 15, 16 within the wiring groove 24a and the contact hole 24b.

(Embodiment 3)

Figure 19:
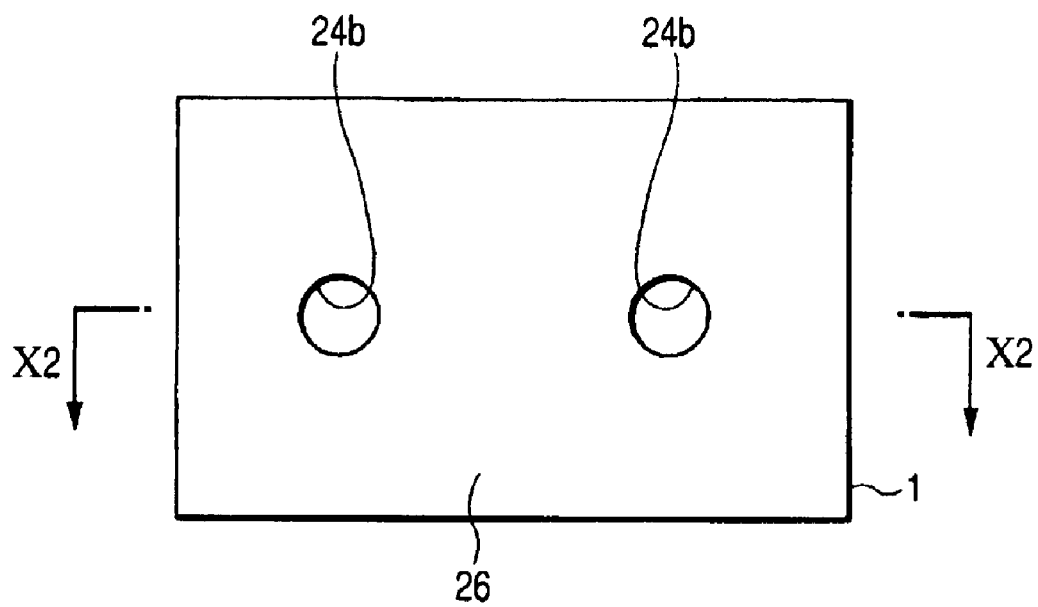
FIG. 19 is a top plan view of the structure during a step in the process of manufacture of a semiconductor device according to a further embodiment of the invention.
Figure 20:
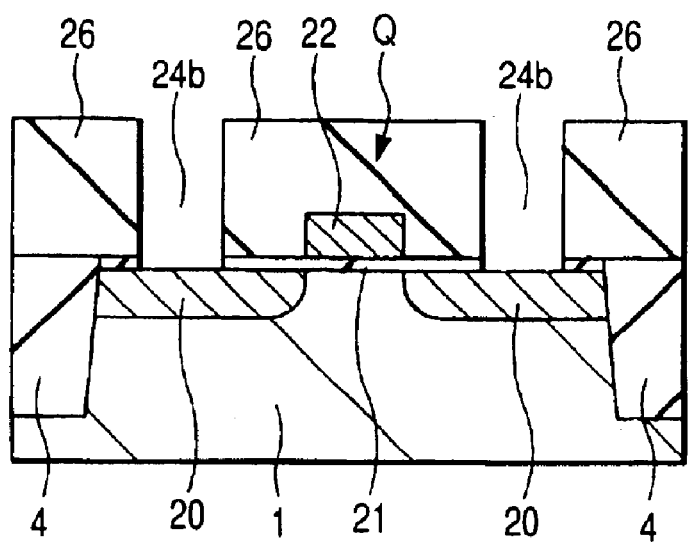
FIG. 20 is a section, taken along the line X2—X2 of FIG. 19.
Figure 21:
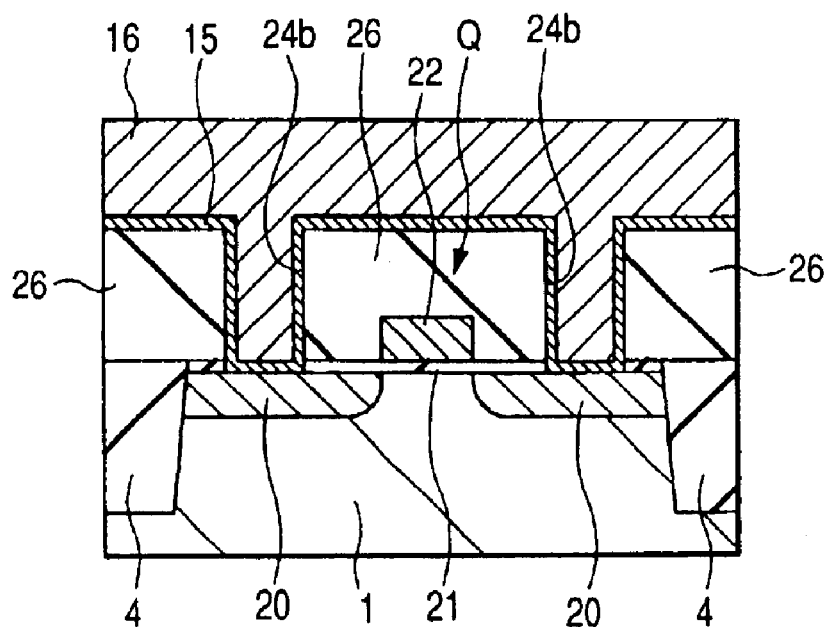
FIG. 21 is an enlarged, sectional view of the structure during a step in the process of manufacture of the semiconductor device, subsequent to the step of FIG. 20.
Figure 22:
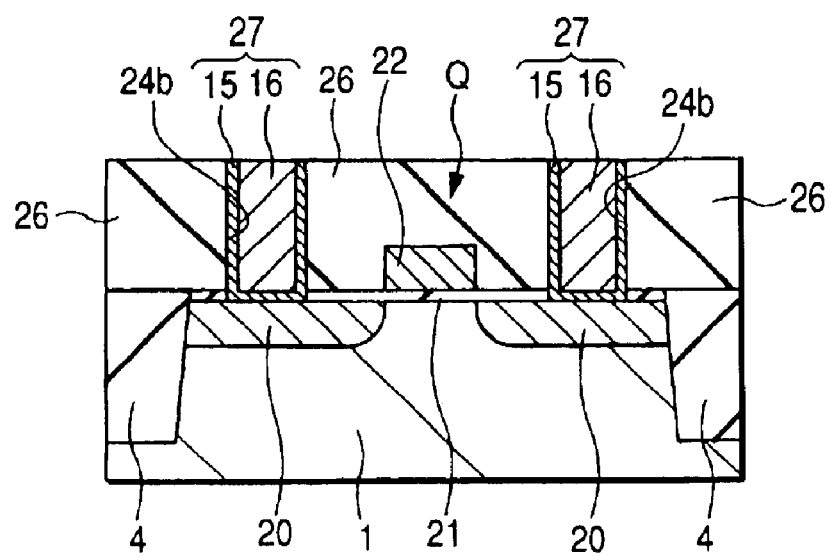
FIG. 22 is an enlarged, sectional view of the structure during a step in the process of manufacture of the semiconductor device, subsequent to the step of FIG. 21.

In Embodiment 3, an application to a buried electrode (plug) formation technique is illustrated with reference to FIGS. 19 to 22. FIG. 19 is a plan view of the structure in the course of the manufacture of a semiconductor device of Embodiment 3, and FIG. 20 is a sectional view taken along the line X2—X2 of FIG. 19. FIGS. 21 and 22 are, respectively, a sectional view of the device at a portion corresponding to the line X2—X2 of FIG. 19 in the course of the manufacture of the semiconductor device, subsequent to the step shown in FIG. 19.

As shown in FIGS. 19 and 20, an insulating film 26 that is made, for example, of a silicon oxide film or the like is deposited on the main surface of a substrate (wafer) 1. This insulating film 26 has formed therein a contact hole (opening for wiring) 24b of a circular form, as seen in plane view, that reaches the main surface of the substrate 1. As shown in FIG. 21, conductor films 15, 16 are successively deposited in order from the lower layer on the main surface of the substrate 1, like the foregoing Embodiments 1, 2. The conductor films 15, 16 are arranged in the same manner as in Embodiments 1, 2. Accordingly, in Embodiment 3, the conductor film 16 can be well buried in the contact hole 24b in a space-free condition and deposited while ensuring the continuity thereof, like Embodiments 1, 2. Subsequently, additional conductor films 16, 15 are, respectively, polished according to a CMP method or the like to form a buried electrode (plug) 27 having the conductor films 15, 16 inside the contact hole 24b, as shown in FIG. 22.

(Embodiment 4)

Figure 23:
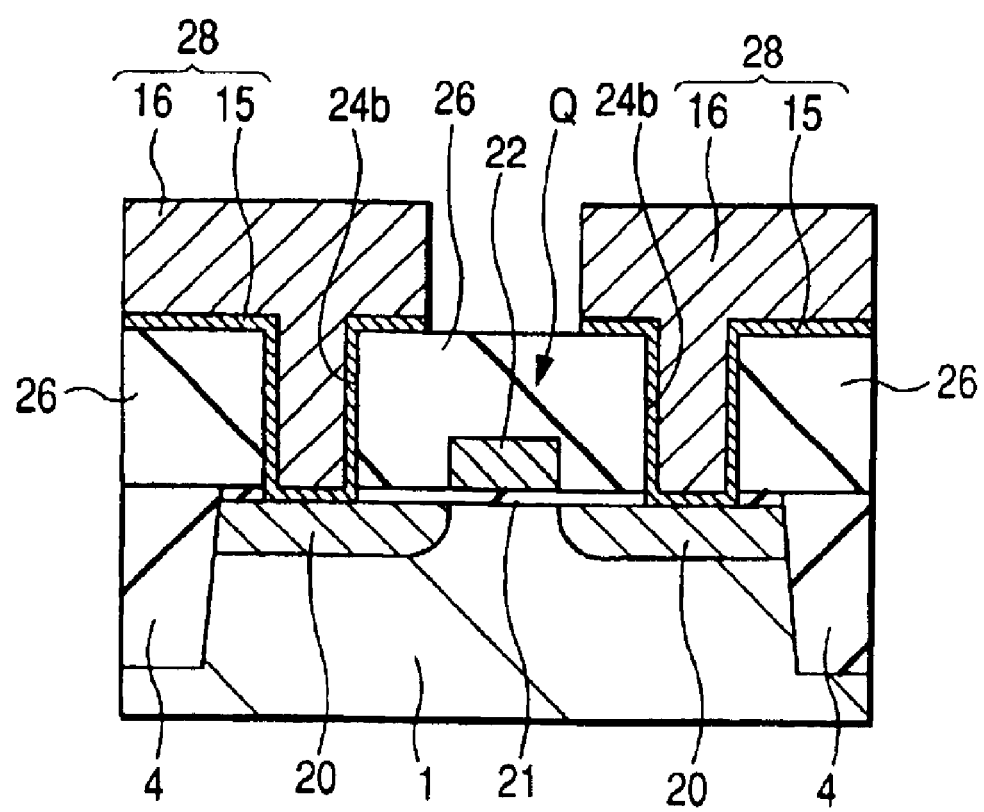
FIG. 23 is a sectional view of the structure during a step in the process of manufacture of a semiconductor device according to a still further embodiment of the invention.

In Embodiment 4, a modification of the foregoing Embodiment 3 is illustrated. FIG. 23 is a sectional view of the structure in the course of the manufacture of a semiconductor device of Embodiment 4. Initially, after carrying out the steps of FIGS. 19 to 21 with respect to the foregoing Embodiment 3, the conductor films 15, 16 of FIG. 21 are, respectively, patterned through use of a resist pattern as an etching mask according to ordinary photolithographic and dry etching techniques to form wirings 28 having the conductor films 15, 16 on the insulating film 26, as shown in FIG. 23. The wirings 28 are electrically connected to the semiconductor regions 20 for the source and drain of MIS Q through the contact holes 24b, respectively.

Although various embodiments of the invention which has been made by us have been particularly described hereinabove, the Invention should not be construed as being limited to these embodiments, and many modifications and changes may be possible without departing from the spirit of the invention.

For instance, although an application to a n-channel power MID has been described by way of example in connection with the foregoing Embodiment 1, the invention is not limited to this case, but may be applied to a p-channel power MIS.

Further, application to a power MIS having a trench gate electrode structure has been described by way of example in connection with Embodiment 1, but the invention is not limited to this application, and may be applied to a power MID having a transverse gate electrode structure formed on the main surface of the substrate.

Moreover, the annealing step 104 in FIG. 6 may be omitted. More particularly, after deposition of the conductor film 16a made of aluminium or the like according to the low temperature sputtering method as employed by way of example in Embodiment 1, the conductor films 16b, 16c, each made of aluminium or the like, may be deposited in order from the lower layer by the heat sputtering method employed in the foregoing Embodiment 1. Additionally, the steps 105, 106 in FIG. 6 may be omitted in some cases. More particularly, the conductor film 16a that is made of aluminium or the like may be deposited using a low temperature sputtering method in Embodiment 1, followed by annealing (step 104 in FIG. 6) in the same manner as in Embodiment 1, thereby causing grooves or holes to be buried with the conductor film 16a made of aluminium or the like.

In the foregoing, applications to the manufacturing method of a semiconductor device having a power MIS, which is in the field of utility to which the present invention is directed, have been described, but the invention should not be construed as being limited only to these applications, but it may be applied, for example, to the manufacture of a semiconductor device having an IGBT (Insulated Gate Bipolar Transistor) with a trench gate electrode structure. More particularly, the invention is applicable to the technique of forming a base electrode and an emitter electrode of an IGBT, each made of aluminium or the like. Alternatively, the invention is also applicable to a power IC (integrated circuit) wherein cell arrays, which respectively have a plurality of transistor cells, each made of a transistor having a trench gate electrode structure and control circuits, are mixed in the same substrate.

The effects of typical embodiments according to the invention will be summarized below.

A first conductor film, which has a structure capable of suppressing or preventing the reaction between aluminium atoms and constituent atoms in a semiconductor substrate upon re-melting or thermal treatment of the conductor film made mainly of aluminium, is deposited on the semiconductor substrate, including openings for wiring. Thereafter, the conductor film made mainly of aluminium flows and is charged into the openings for wiring through a thermal treatment for re-melting after or during the deposition of the conductor film, thus making it possible to suppress or prevent a junction failure from occurring. This eventually leads to improved reliability of the resultant semiconductor device.

What is claimed is:

1. A method of manufacturing a semiconductor device including a plurality of MISFETS each having a gate electrode, a source region and a drain region, comprising the steps of:

(a) providing a semiconductor substrate;

(b) forming the plurality of MISFETS on the semiconductor substrate;

(c) forming an interlayer insulating film over the plurality of MISFETS;

(d) forming openings in the insulating film to expose each of the source regions;

(e) forming barrier metals in each of the openings;

(f) forming a first aluminum-based conductor film over the barrier metals in each of the openings by a sputtering method;

(g) heating the semiconductor substrate to a temperature over 400° C. to reflow the first aluminum-based conductor film to bury each of the openings partially;

(h) forming a second aluminum-based conductor film on the first aluminum-based conductor film by a heat sputtering method; and (i) patterning the first and second aluminum-based conductor films to form a source electrode and a gate wiring, wherein:

a drain electrode is formed on a back surface of the semiconductor substrate;

the source electrode is formed continuously over each of the source regions and electrically connected with each of the source regions of the plurality of MISFETS;

in the step (h), a heating temperature of the semiconductor substrate is set between 400° C. and 550° C.;

in the step (h), the second aluminum-based conductor film is deposited while heating the semiconductor substrate from a back side of the semiconductor substrate; and in the step (h), the second aluminum-based conductor film flows and runs into the openings.

2. A method of manufacturing a semiconductor device according to claim 1, wherein each of the gate electrodes, source regions and drain regions of the plurality of MISFETS are electrically connected respectively.

3. A method of manufacturing a semiconductor device according to claim 1, wherein the plurality of MISFETS comprises a power MISFET.

4. A method of manufacturing a semiconductor device according to claim 1, wherein after the step (g), recesses are left at upper surfaces of the first aluminum-based conductor film within each of the openings.

5. A method of manufacturing a semiconductor device according to claim 1, further comprising the step of:
(h1) after the step (h), forming a third aluminum-based conductor film, on the second aluminum-based conductor film, by the heat sputtering method, and
wherein in the step (i), the third aluminum-based conductor film is also patterned to form the source electrode and the gate wiring.

6. A method of manufacturing a semiconductor device according to claim 5, wherein a deposition rate of the third aluminum-based conductor film in the step (h1) is greater than a deposition rate of the second aluminum-based conductor film in the step (h).

7. A method of manufacturing a semiconductor device according to claim 1, wherein the barrier metal has a structure capable of at least suppressing, in the step (g), a reaction between aluminum atom in the aluminum-based conductor film and a constituent atom in the semiconductor substrate.

8. A method of manufacturing a semiconductor device according to claim 7, wherein the barrier metal is comprised of TiW.

9. A method of manufacturing a semiconductor device according to claim 7, wherein the semiconductor substrate is comprised of silicon.

10. A method of manufacturing a semiconductor device according to claim 1, wherein the gate electrodes are formed in trenches formed on a main surface of the semiconductor substrate.

11. A method of manufacturing a semiconductor device according to claim 1, wherein in the steps (f) and (h), the first and second aluminum-based conductor films are formed in a same sputtering apparatus.

12. A method of manufacturing a semiconductor device according to claim 1, wherein:

the opening is comprised of a first groove and a second groove;
the first groove is formed in a main surface of the semiconductor substrate;
the second groove is formed in the interlayer insulating film;
the second groove is located on the first groove; and
the first and second grooves are connected.

13. A method of manufacturing a semiconductor device according to claim 12, wherein a width of the second groove is greater than a width of the first groove in a sectional plan of the semiconductor device.

14. A method of manufacturing a semiconductor device according to claim 13, wherein the source electrode and the source regions of the plurality of MISFETS are contacted at upper surfaces and side surfaces of the source regions.

15. A method of manufacturing a semiconductor device according to claim 13, wherein said first aluminum-based conductor film fills the first groove.

16. A method of manufacturing a semiconductor device according to claim 1, wherein said barrier metals are formed in a layer with such a thickness that in subsequent processing in forming and patterning the aluminum-based conductor films, the barrier metals are not converted into a silicide through the entire thickness of the layer of the barrier metals.

17. A method of manufacturing a semiconductor device according to claim 1, wherein the first aluminum-based conductor film is formed at a lower temperature than that which the second aluminum-based conductor film is formed.

18. A method of manufacturing a semiconductor device according to claim 1, wherein after forming the second aluminum-based conductor film, the openings are substantially completely buried.

* * * * *